(12) United States Patent
Wang et al.

(10) Patent No.: US 11,942,304 B2
(45) Date of Patent: **\*Mar. 26, 2024**

(54) FIELD PROGRAMMABLE DETECTOR ARRAY

(71) Applicant: ASML NETHERLANDS B.V., Veldhoven (NL)

(72) Inventors: Yongxin Wang, San Ramon, CA (US); Zhonghua Dong, Sunnyvale, CA (US); Rui-Ling Lai, Chang-Hua (TW)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/856,848

(22) Filed: Jul. 1, 2022

(65) Prior Publication Data

US 2022/0415608 A1 Dec. 29, 2022

Related U.S. Application Data

(63) Continuation of application No. 16/648,288, filed as application No. PCT/EP2018/074833 on Sep. 14, 2018, now Pat. No. 11,430,629.

(Continued)

(51) Int. Cl.
*H01J 37/244* (2006.01)
*H01L 27/146* (2006.01)

(52) U.S. Cl.
CPC ...... *H01J 37/244* (2013.01); *H01L 27/14603* (2013.01); *H01L 27/14609* (2013.01); *H01J 2237/2446* (2013.01)

(58) Field of Classification Search
CPC ............ H01J 37/244; H01J 2237/2446; H01L 27/14603; H01L 27/14609
See application file for complete search history.

(56) References Cited

U.S. PATENT DOCUMENTS

| 5,386,115 A | 1/1995 | Freidhoff et al. |
| 6,137,151 A | 10/2000 | Street |

(Continued)

FOREIGN PATENT DOCUMENTS

| CN | 102934526 A | 2/2013 |
| CN | 103176199 A | 6/2013 |

(Continued)

OTHER PUBLICATIONS

Notice of Reasons for Rejection issued by the Japanese Patent Office in related JP Application No. 2020-512850, dated Feb. 3, 2021 (5 pgs.).

(Continued)

*Primary Examiner* — Thanh Luu
*Assistant Examiner* — Monica T Taba
(74) *Attorney, Agent, or Firm* — Finnegan, Henderson, Farabow, Garrett & Dunner, LLP

(57) ABSTRACT

Systems and methods for implementing a detector array are disclosed. According to certain embodiments, a substrate comprises a plurality of sensing elements including a first element and a second element, and a switching region therebetween configured to connect the first element and the second element. The switching region may be controlled based on signals generated in response to the sensing elements receiving electrons with a predetermined amount of energy.

20 Claims, 18 Drawing Sheets

Related U.S. Application Data

(60) Provisional application No. 62/560,135, filed on Sep. 18, 2017.

(56) References Cited

U.S. PATENT DOCUMENTS

| | | | |
|---|---|---|---|
| 7,057,147 B1 | 6/2006 | Yu | |
| 2008/0173811 A1* | 7/2008 | Kobayashi | H01J 37/3171 |
| | | | 250/292 |
| 2010/0012865 A1 | 1/2010 | Hogan | |
| 2011/0249791 A1 | 10/2011 | Wang et al. | |
| 2012/0241606 A1 | 9/2012 | Han et al. | |
| 2013/0134307 A1* | 5/2013 | Routh, Jr. | H01J 37/077 |
| | | | 250/307 |
| 2013/0163722 A1 | 6/2013 | Okada et al. | |
| 2013/0224662 A1* | 8/2013 | Suzuki | B82Y 10/00 |
| | | | 250/397 |
| 2014/0263999 A1* | 9/2014 | Ramsey | H01J 49/10 |
| | | | 250/281 |
| 2015/0090879 A1 | 4/2015 | Zeidler et al. | |
| 2015/0115131 A1* | 4/2015 | Webster | H04N 25/772 |
| | | | 250/208.1 |
| 2016/0260396 A1 | 9/2016 | Miyake | |
| 2017/0170001 A1 | 6/2017 | Ramsey | |

FOREIGN PATENT DOCUMENTS

| | | |
|---|---|---|
| CN | 104576667 A | 4/2015 |
| JP | 2006-079911 A | 3/2006 |
| JP | 2007-128914 A | 5/2007 |
| JP | 2009-078143 A | 4/2009 |
| JP | 2010-136283 A | 6/2010 |
| JP | 2012-080206 A | 4/2012 |
| JP | 2012-120030 A | 6/2012 |
| JP | 2013-132034 A | 7/2013 |
| JP | 2013-150304 A | 8/2013 |
| JP | 2017-067501 A | 4/2017 |
| JP | 2017-526142 A | 9/2017 |
| TW | 2007-12795 A | 4/2007 |

OTHER PUBLICATIONS

First Office Action issued in related Chinese Patent Application No. 201880060358.X; dated Dec. 31, 2021 (17 pgs.).
International Search Report for corresponding International Application No. PCT/EP2018/074833, dated Feb. 12, 2019 (7 pages).
Notification of Second Office Action issued by the Patent Office of the People's Republic of China in related Chinese Patent Application No. 201880060358.X; dated Aug. 23, 2022 (8 pgs.).

* cited by examiner

FIELD PROGRAMMABLE DETECTOR ARRAY

CROSS-REFERENCE TO RELATED APPLICATIONS

This application is a continuation application of Ser. No. 16/648,288, filed Mar. 18, 2020, which is a national stage filing under 35 U.S.C. § 371 of International Application No. PCT/EP2018/074833 filed Sep. 14, 2018, and published as WO 2019/053173, which claims priority of U.S. application No. 62/560,135 which was filed on Sep. 18, 2017. The contents of these applications are incorporated herein by reference in their entireties.

TECHNICAL FIELD

The present disclosure generally relates to the field of detector arrays, and more particularly, to a field programmable detector array applicable for charged particle detection.

BACKGROUND

Detectors are used in various fields for sensing physically observable phenomena. For example, electron microscopes are useful tools for observing the surface topography and composition of a sample. In a charged particle beam tool used for microscopy, charged particles are directed to a sample and may interact with the sample in various ways. For example, after hitting a sample, secondary electrons, backscattered electrons, auger electrons, x-rays, visible light, etc. may be scattered from the sample and detected by a detector. The scattered particles may form a beam incident on the detector.

Detectors include an active area in which electric current is generated in response to being hit with charged particles. The instantaneous current generated by the detector provides a direct measure of the flux on the active surface. Some exemplary types of detectors include point detectors and area detectors. Point detectors include a single area and a single channel for reading out the output. Point detectors may thus read out data at very high speeds, and may be limited only by the read out speed of the coupled electronics. However, point detectors average the detected signal over the whole active area and thus provide no spatial information on the detected signal.

Area detectors have been developed which can provide spatial information but are more complicated and expensive than point detectors. Area detectors are typically pixelated to form a grid of discrete detection elements. A physical arrangement of an area detector may comprise a plurality of pixels each including an active area that is surrounded by an isolation area to separate it from a neighboring pixel. The active area is the total area sensitive to irradiation and usable for sensing.

In an electron beam detector that may be applicable in multi-beam wafer inspection systems, a detector may be provided that includes a plurality of point detectors. The detector may receive electrons from samples and converts the electron beam intensity into electronic signals so that an image of the sample can be reconstructed. In existing systems, each beam or beamlet of a multi-beam system has a corresponding electron sensing element in the detector. The system requires precise control to align each sensing element of the detector array to one beam.

Some further drawbacks of existing electron detectors based on point detectors may be that these detectors cannot provide any information of how the electron optical subsystem performs. These detectors cannot compensate for any drift and imperfection of the electron optical subsystem.

A type of area detector includes a detector array that provides multiple electron sensing elements are used to detect one or more electron beams. A detector array may solve some of the issues of point detectors. Furthermore, such a detector array having multiple electron sensing elements associated with a beam may provide some flexibility. For example, the detector array may be able to change which pixels are associated with a beam. It is advantageous in some applications to form separate groups of pixels. However, even such a detector array faces drawbacks in that it is complex, difficult to manufacture, has a large dead area, and is difficult to scale up.

Thus, existing electron detectors may be classified into two groups. For example, one has a simple arrangement that is easy to manufacture, but has no flexibility. The other has a complex arrangement that has flexibility but is hard to manufacture and requires large scale complex signal conditioning and signal routing circuits. The latter prohibits the further scaling up of a wafer inspection system.

SUMMARY

Embodiments of the present disclosure provide systems and methods for charged particle detection. In one embodiment, a detection system is provided. The detection system may comprise a detector.

In some embodiments, a detector may include a substrate having a plurality of sensing elements. Among the sensing elements may be a first element and a second element. The substrate may also include a switching region configured to connect the first element and the second element. The first element may be configured to generate a first signal in response to the first element detecting a beam, and the second element may be configured to generate a second signal in response to the second element detecting the beam. The switching region may be configured to be controlled based on the first signal and the second signal.

In some embodiments, a detector may include a sensor layer having an array of sensing elements including a first element and a second element where the first element and the second element are adjacent. The sensor layer may also include a switching region between the first element and the second element. The detector may also include a circuit layer having one or more circuits electrically connected to the first element and the second element. The one or more circuits may be configured to generate a first status indicator when the first element receives charged particles with a predetermined amount of energy, generate a second status indicator when the second element receives charged particles with a predetermined amount of energy, and control the switching region based on the first status indicator and the second status indicator.

In some embodiments, a detector system may include a detect or array with a plurality of sensing elements including a first element and a second element, and a switching region configured to connect the first element and the second element. The detector system may also include one or more circuits configured to generate a first signal in response to the first element detecting a beam, and generate a second signal in response to the second element detecting the beam. A controller may be provided that is connected to the one or more circuits.

According to some embodiments, an arrangement can be achieved which eliminates a trade-off relationship between pixel count and detector manufacturing. A detector can be provided that achieves a high pixel count without corresponding manufacturing difficulties.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

DESCRIPTION OF EMBODIMENTS

Figure 1:
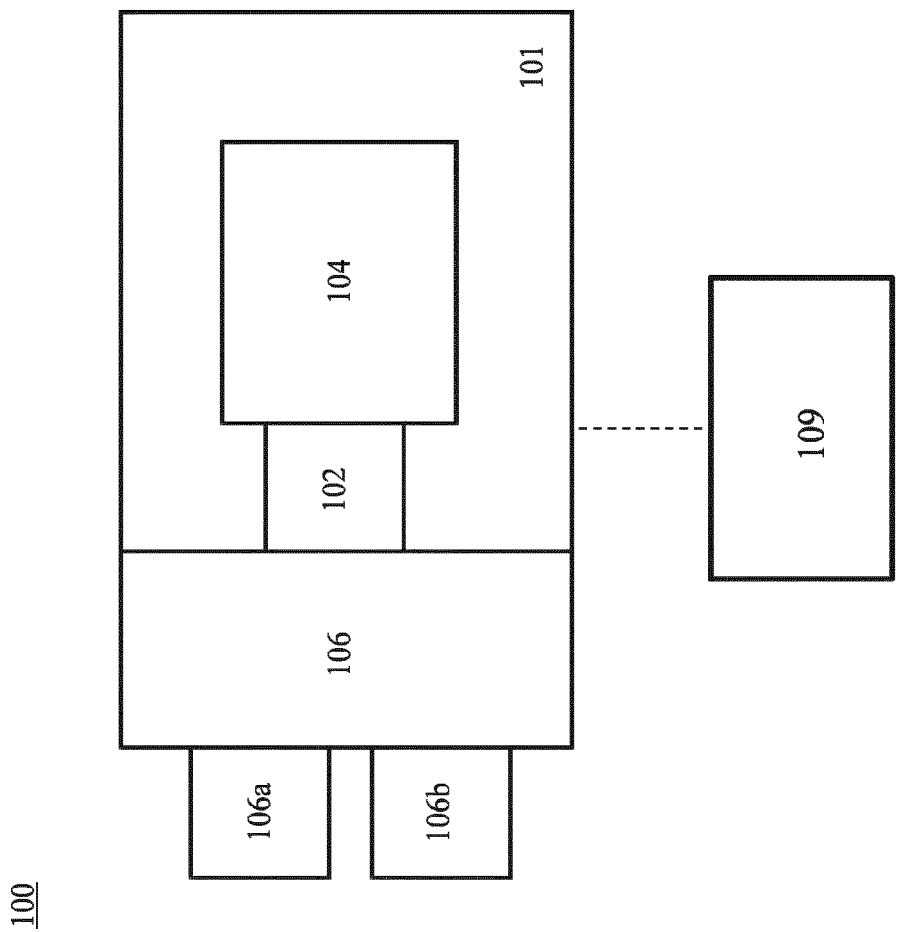
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the subject matter as recited in the appended claims.

Embodiments of the present disclosure provide a detector having an array architecture. The detector may enable field reconfiguration of sensing elements included on an array surface of the detector. The detector may comprise switching elements, such as switches formed between pairs of sensing elements which control the connection between the two sensing elements of the pair.

Switches configured to connect two sensing elements can be formed within a sensing layer of a detector array. In this manner, the detector array eliminates the need for a separate switch matrix.

Switching elements may comprise a transistor, such as a MOSFET. A MOSFET may have a gate that is controlled by logical elements.

The sensing elements can form an arbitrary number of groups with arbitrary shapes and an arbitrary number of sensing elements in each group. A control circuit for each switch may be located beside each corresponding switch. The control circuit may comprise logical elements. The switch between pairs of sensing elements can be addressed by row control and/or line control wires.

An array of sensing elements can be formed as a sensor layer in a substrate. The control circuit may be formed as a circuit layer in a substrate. In an arrangement consistent with aspects of the present disclosure, interconnections in the circuit layer can be simplified. Output signal of each group of sensing elements can be routed through multiple output wires connected to the group. The output wires, together with connections between sensing elements formed by the switches in the group, can form a network having a low equivalent output serial resistance and serial inductance. For example, in some embodiments, a control circuit may form a network that has reduced equivalent output serial resistance and serial inductance compared to a conventional area detector array. Output impedance of grouped sensing elements can be reduced such that wide band operation is facilitated.

Embodiments of the present disclosure provide an electron beam tool with an electron detector. A circuit layer may be provided which is coupled with the electron detector. The electron detector can be configured to receive backscattered primary electrons and secondary electrons emitted from a sample. The received electrons form one or more beam spots on a surface of the detector. The surface of the detector can include a plurality of electron sensing elements configured to generate electrical signals in response to receiving the electrons.

In some embodiments, the circuit layer may comprise pre-processing circuitry and signal processing circuitry that are used to configure grouping of the plurality of electron sensing elements. For example, the pre-processing circuitry and signal processing circuitry can be configured to generate indications related to the magnitude of the generated electrical signals. Such circuitry may comprise logic blocks, such as a gate associated with two sensing elements of the plurality of sensing elements. The gate may be controlled such that the two sensing elements are connected or disconnected via the switching element between the two sensing elements. Electrical signals generated from the sensing elements may be configured to pass through the switching element. Determinations may be made based on electrical signals from the sensing elements.

Post-processing circuitry may be configured to interact with a controller configured to acquire an image of beams or beamlets based on the output of the sensing elements. The controller may reconstruct an image of the beam. The controller may be configured to determine beam boundaries based on the reconstructed image, for example primary and secondary boundaries of a beam spot.

Further implementations of post-processing circuitry may comprise one or more circuits that can be configured to determine, based on generated indications from the pre-processing circuitry, which of the electron sensing elements lie within a boundary of a beam spot, for example a primary boundary. Processing may be carried out to generate a value representing the intensity of a beam spot based on the determined primary boundary. In some embodiments, a grouping can be used to determine which of the electron sensing elements lie outside the primary boundary of the beam spot. Noise signals may be estimated based on the output of sensing elements determined to be outside the primary boundary. Post-processing circuitry can compensate for the estimated noise signals when generating the intensity data of the beam spot.

Grouping of sensing elements may be based on electrical signals generated by the sensing elements in response to being hit by electrons of an electron beam. Grouping may be based on electrical signals passing through the switching element connecting neighboring sensing elements. Grouping may also be based on determinations by post-processing circuitry. For example, in some embodiments, primary and/or secondary beam spot boundaries may be determined based on output signals of the sensing elements.

Local control logic associated with a pixel may generate an indication of the signal level of the corresponding sensing element. This indication can be used to determine whether two adjacent sensing elements should be connected by the switching element. In this manner, groups can be formed. Based on the formed groups of sensing elements, a primary boundary can be determined. Furthermore, in some embodiments, gradient information can be obtained and used to determine a secondary boundary.

Electrons of an incident electron beam may have different properties, e.g., different energy due to different generation processes. Distribution or concentrations of electrons with different properties may vary at different locations. Thus, within an electron beam, an intensity pattern in the detected electron beam spot may correspond to primary or secondary boundaries. Primary and secondary beam spot boundaries can be used to group output signals of corresponding electron sensing elements. The groups can be formed so that their geometrical arrangement matches the pattern of the corresponding electron beam spot. As an example, a portion of the electron beam spot detected by electron sensing elements within the secondary beam boundary may consist almost entirely of backscattered electrons while a portion of the electron beam spot detected by electron sensing elements between the primary and secondary beam boundaries may consist almost entirely of secondary electrons. The formed groups can therefore yield intensity information of the entire detected beam and also the intensity information corresponding to the backscattered and secondary electron portions of the electron beam. Accordingly, some embodiments can provide information about the detected electron beam spots and properties of the sample under investigation.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference will now be made in detail to the example embodiments, which are illustrated in the accompanying drawings. Although the following embodiments are described in the context of utilizing electron beams, the disclosure is not so limited. Other types of charged particle beams can be similarly applied. Furthermore, detectors consistent with aspects of the present disclosure are applicable in environments for sensing x-rays, photons, and other forms of energy.

Reference is now made to FIG. 1, which illustrates an exemplary electron beam inspection (EBI) system 100 consistent with embodiments of the present disclosure. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples are collectively referred to as "wafers" hereafter).

One or more robot arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to the electron beam tool 104. The controller 109 may be a computer configured to execute various controls of the EBI system.

Figure 2:
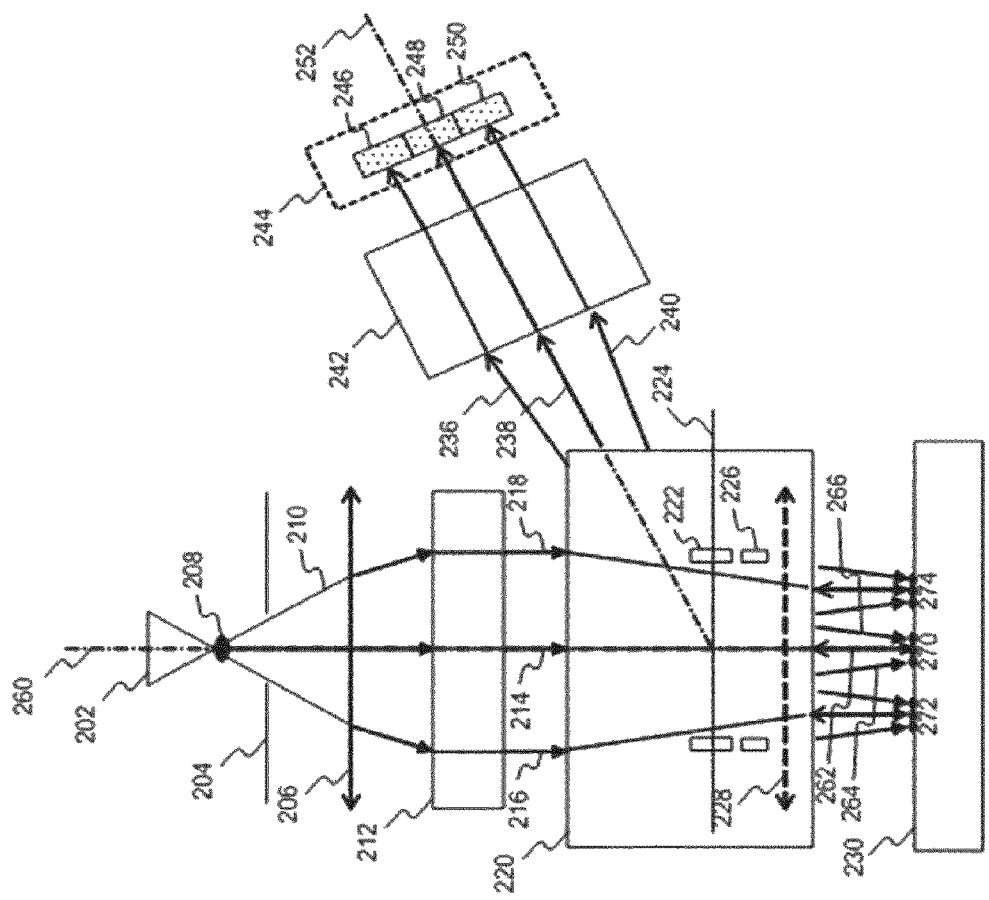
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates an electron beam tool 104 (also referred to herein as apparatus 104) comprising an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and an electron detection device 244. Primary projection optical system 220 can comprise a beam separator 222, deflection scanning unit 226, and objective lens 228. Electron detection device 244 can comprise detection sub-regions 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and electron detection device 244 can be aligned with a secondary optical axis 252 of apparatus 104.

Electron source 202 can comprise a cathode, an extractor or an anode, wherein primary electrons can be emitted from the cathode and extracted or accelerated to form a primary electron beam 210 with a crossover (virtual or real) 208.

Primary electron beam 210 can be visualized as being emitted from crossover 208. Gun aperture 204 can block off peripheral electrons of primary electron beam 210 to reduce Coulomb effect. The Coulomb effect can cause an increase in size of probe spots 270, 272, and 274.

Source conversion unit 212 can comprise an array of image-forming elements (not shown in FIG. 2) and an array of beam-limit apertures (not shown in FIG. 2). The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit the plurality of beamlets 214, 216, and 218.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for inspection and can form a plurality of probe spots 270, 272, and 274 on surface of wafer 230.

Beam separator 222 can be a beam separator of Wien filter type generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can also be non-zero. Beam separator 222 can separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 can be emitted from wafer 230. Secondary electron beams 236, 238, and 240 can comprise electrons with a distribution of energies including secondary electrons (energies≤50 eV) and backscattered electrons (energies between 50 eV and landing energies of beamlets 214, 216, and 218). Secondary optical system 242 can focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3A:
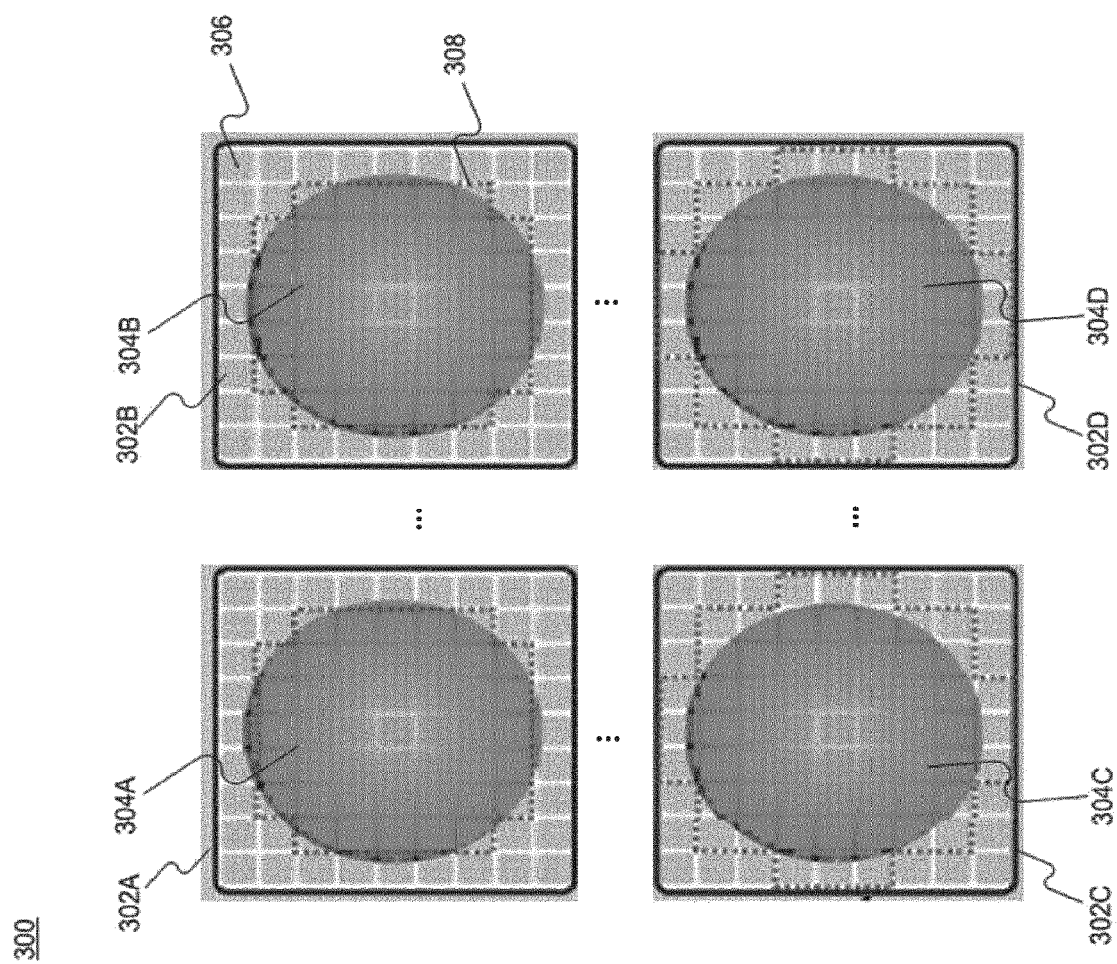
FIGS. 3A-3E are diagrams illustrating exemplary surfaces of a detector array, consistent with embodiments of the present disclosure.

Reference is now made to FIG. 3A, which illustrates an exemplary structure of a sensor surface 300 that can form a detection surface of electron detection device 244. Sensor surface 300 can be divided into four regions 302A-D (2×2 rectangular grid), each region 302 capable of receiving a corresponding beam spot 304 emitted from a particular location from wafer 230. All beam spots 304A-D may exhibit an ideal round shape and have no loci offset. While four regions are displayed, it is appreciated that any plurality of regions could be used. Furthermore, a division of sensor surface 300 into four regions is arbitrary. An arbitrary selection of sensing elements 306 can be taken to form a particular region. Detection sub-regions 246, 248, 250 in detector 244 may be constituted by such regions.

Each sensor region can comprise an array of electron sensing elements 306. The electron sensing elements may comprise, for example, a PIN diode, avalanche diode, electron multiplier tube (EMT), etc., and combinations thereof. Moreover, it is appreciated that while FIG. 3A shows each region 302 being separated from each other as predefined regions having their own sensing elements 306, these predefined regions may not exist, e.g., such as surface sensor 400 of FIG. 3C. For example, instead of having 4 predefined regions each having 81 sensing elements (a 9×9 grid of sensing elements), a sensor surface could have one 18×18 grid of sensing elements, still capable of sensing four beam spots.

Electron sensing elements 306 can generate a current signal commensurate with the electrons received in the sensor region. A pre-processing circuit can convert the generated current signal into a voltage signal (representing the intensity of received electron beam spot). The pre-processing circuit may comprise, for example, a high speed transimpedance amplifier. A processing system can generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

While electron sensing element 306 is described as receiving electrons from an electron beam, in the case of other types of detectors, a sensor surface may be configured to generate a signal in response to receiving other types of irradiation. For example, a detector may react to charged particles having a particular charge. Also, a detector may be sensitive to flux, spatial distribution, spectrum, or other measurable properties. Thus, a detector sensing element may be configured to generate a signal in response to receiving a certain type or level of energy, for example, electrons having a predetermined amount of energy.

In some embodiments, the processing system can selectively sum the signals generated by some of the electron sensing elements 306 to generate an intensity value of a beam spot. The selection can be based on a determination of which of the electron sensing elements are located within the beam spot.

In some embodiments, the processing system can identify which of the electron sensing elements are located outside a beam spot, and which of the electron sensing elements are located within the beam spot, by identifying a boundary of the beam spot. For example, referring to FIG. 3B, the processing system can identify primary boundaries 312A, 312B and secondary boundaries 314A, 314B for beam spots 304A and 304B, respectively. Primary boundary 312 can be configured to enclose a set of electron sensing elements 306 of which the signal outputs are to be included to determine an intensity of the beam spot.

Secondary boundary 314 can be configured to enclose a center portion of the beam spot, and can be used to provide certain geometric information of the beam spot. The geometric information may include, for example, a shape of the beam spot, one or more loci of the beam spot, etc. Here, the loci may refer to a predetermined location within the beam spot, such as a center. The processing system may also determine primary boundary 312 based on secondary boundary 314.

Moreover, based on the loci information, the processing system can also track a drift in the location of a beam spot 304 due to, for example, imperfections within the electron optics components or the electron optics system. Imperfections may be those introduced during manufacturing or assembling processes. Furthermore, there may be drift introduced during long-term operation of the system. The processing system can update the boundary determinations, and the set of electron sensing elements to be included in the intensity determination, to mitigate the effects of the drifting on the accuracy of intensity determination. Further, the processing system may track shifts in the electron beam spots.

Figure 3B:
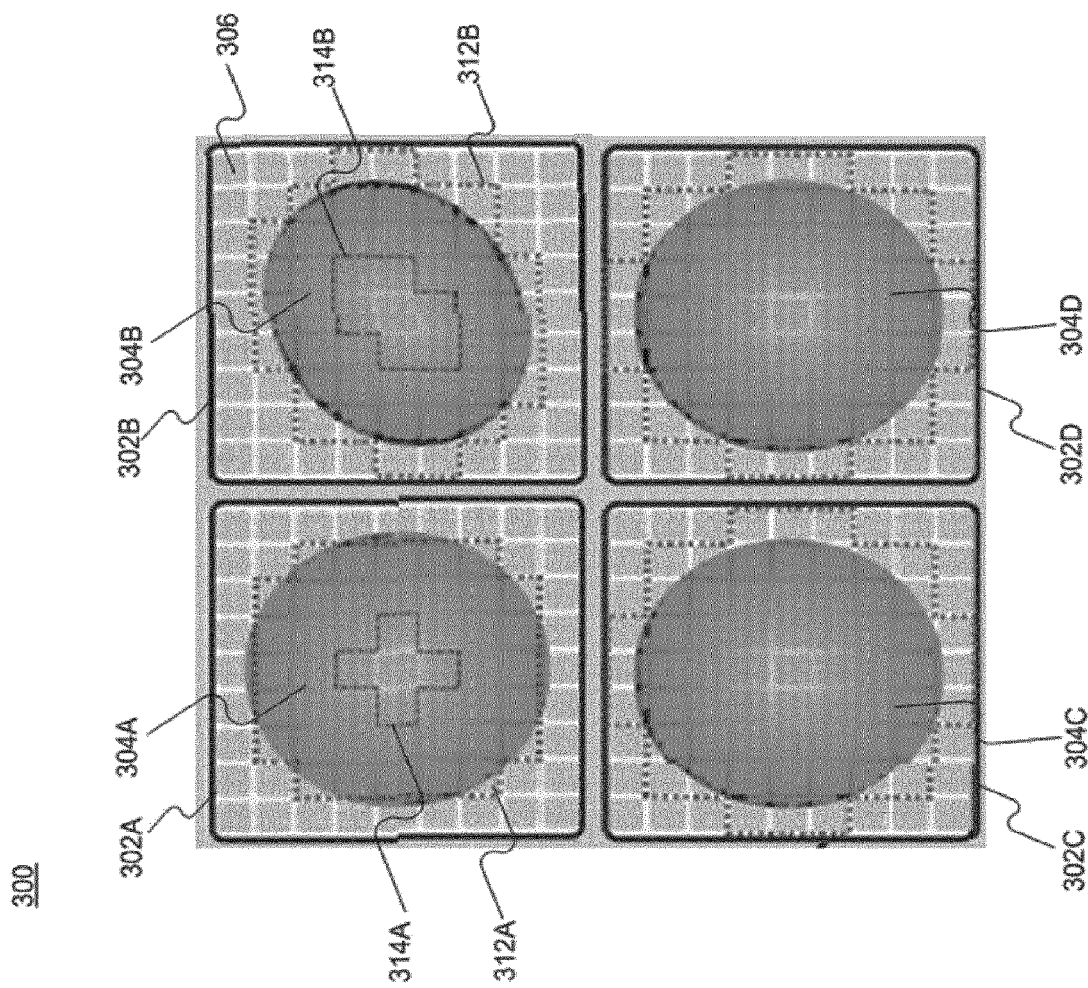
Figure 3C:
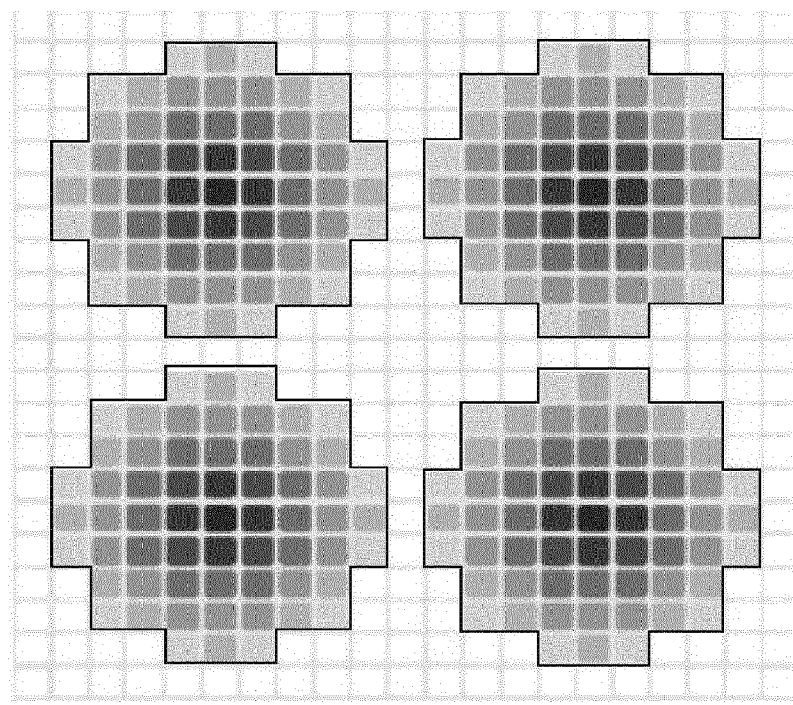

The selection of the electron sensing elements 306 that are used to form each set of electron sensing elements surrounded by primary or secondary boundaries 312 and 314 can be determined by a designated electron collection ratio of each beam spot, which is related to the overall image signal strength and signal to noise ratio, the signal crosstalk of the adjacent electron beams, and the corresponding shape and locus of each electron beam spot. Selection of electron sensing elements may be controlled by processing circuitry located adjacent to the sensing elements or by an external controller, for example. The formation of each set may be static or may vary dynamically. Shape and locus variation information of beam spots may be used, for example, to monitor performance of the electron optical system (e.g., primary projection optical system 220). Information collected regarding the positioning and shape of the beam can be used, for example, in making adjustments to the electron optical system. Accordingly, while FIG. 3B shows beam spot 304B having a shape deviating from a round shape, such types of deviations such as location, shape, and grid information due to drift in the electron optical system or imperfections of the components in the electron optical system can be compensated for.

Figure 3D:
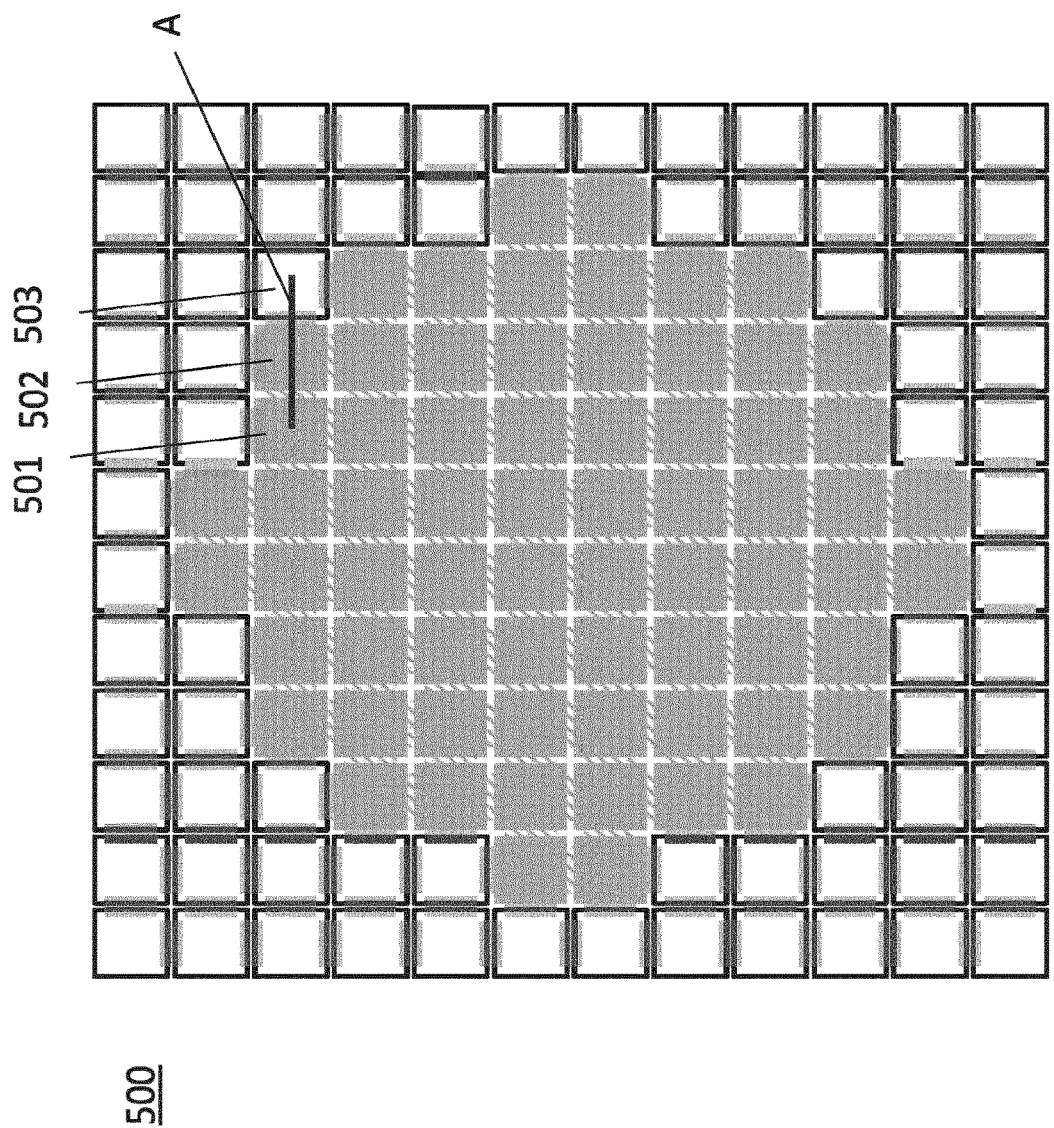

Reference is now made to FIG. 3D, which illustrates an exemplary structure of a sensor surface 500 which can be used on electron detection device 244. Sensor surface 500 has an array structure comprising a plurality of sensing elements, including sensing elements 501, 502, 503, and so on, each capable of receiving at least a part of a beam spot. Sensing elements 501, 502, 503 may be configured to generate an electrical signal in response to receiving energy.

The sensing element may comprise, for example, a PIN diode, avalanche diode, electron multiplier tube (EMT), and the like, and combinations thereof. For example, sensing elements 501, 502, 503 may be electron sensing elements. Electron sensing elements can generate a current signal commensurate with the electrons received in the sensor active area. A processing circuit can convert the generated current signal into a voltage signal (representing the intensity of the received electron beam spot). A processing system can generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

Figure 3E:
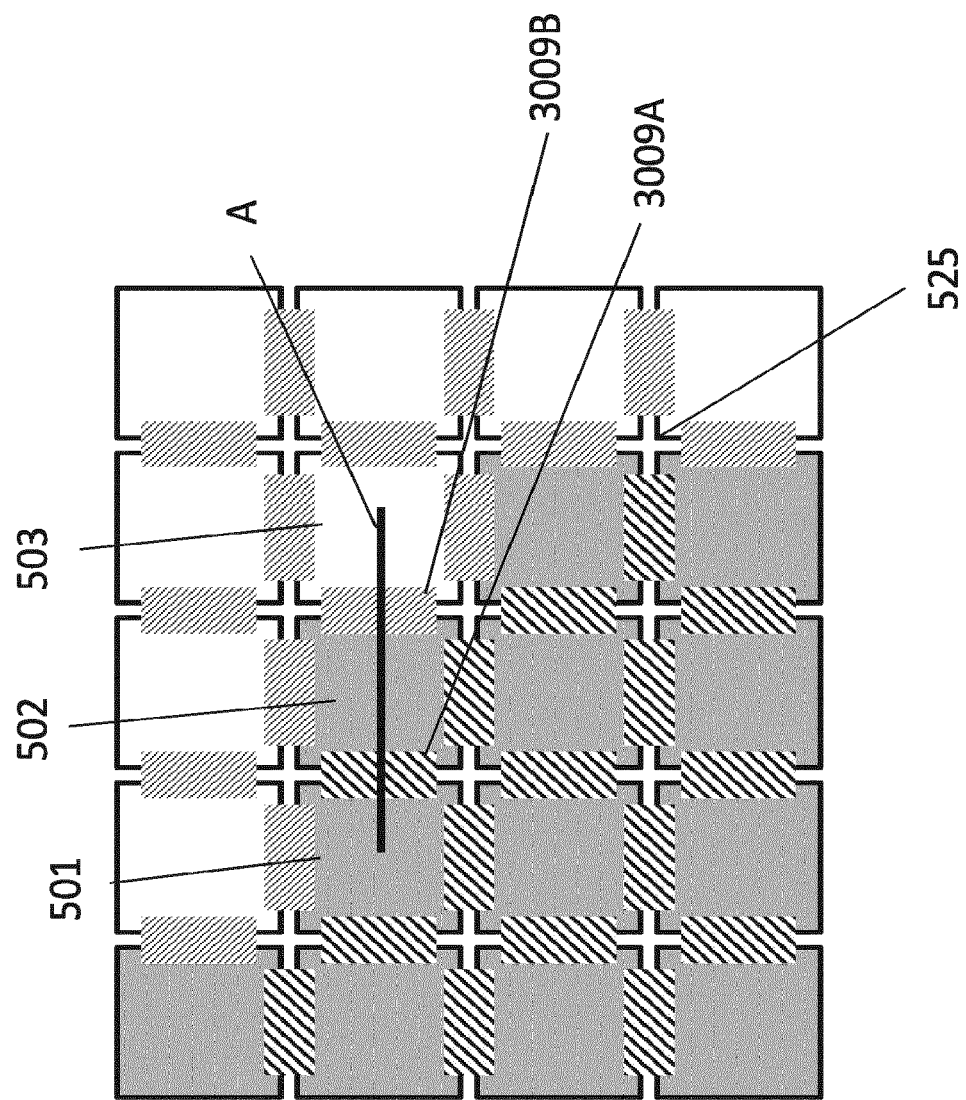
Figure 4A:
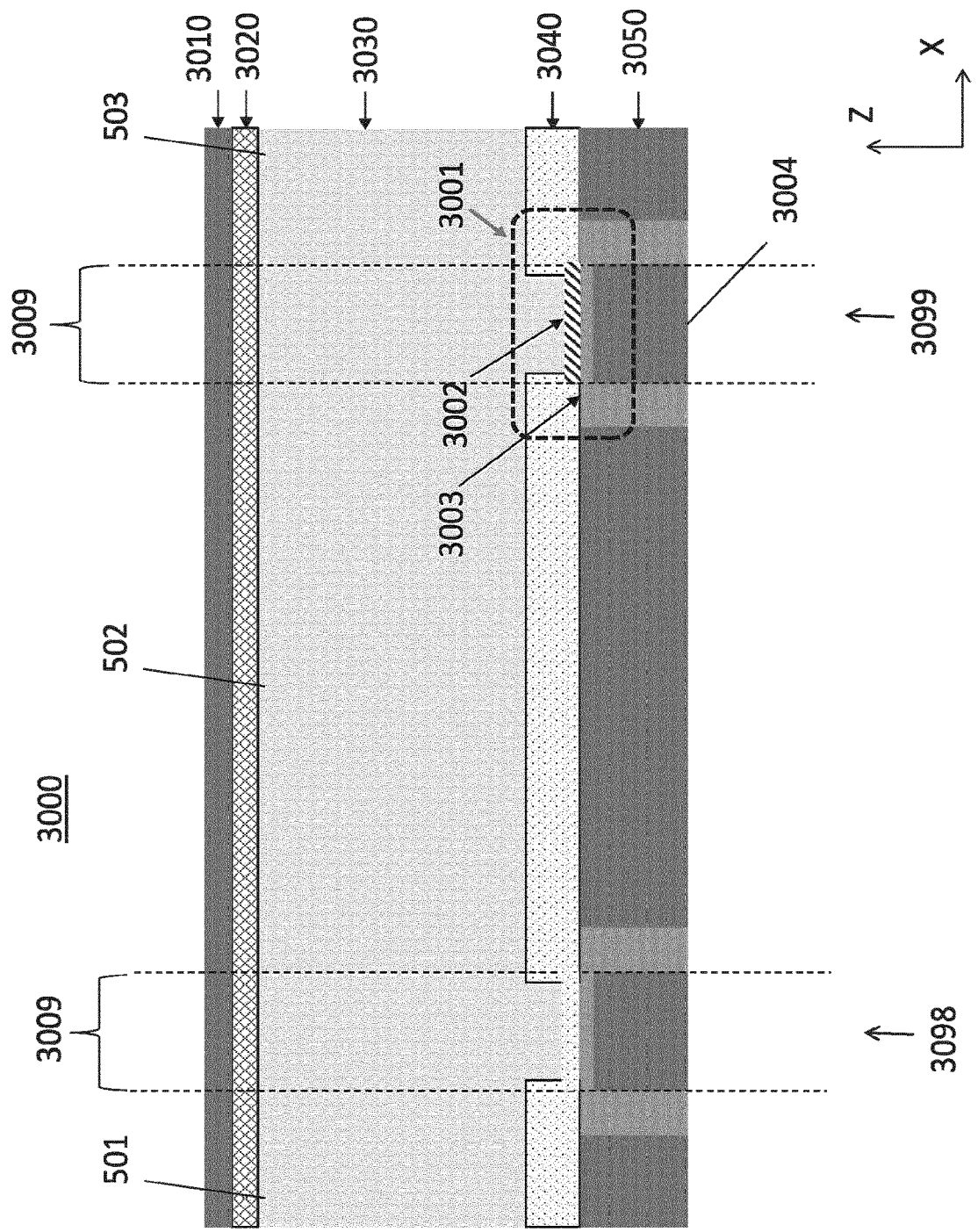
FIGS. 4A-4E are diagrams illustrating a cross sectional view of a detector taken along the line A of FIG. 3D or FIG. 3E, consistent with embodiments of the present disclosure.

FIG. 3E illustrates an enlarged portion of a region shown in FIG. 3D. FIG. 4A shows an exemplary structure of sensor elements taken along a cross section in the thickness direction of the detector array of the portion A indicated in FIG. 3D and FIG. 3E.

As illustrated in FIG. 4A, sensing elements 501, 502, 503 may be configured as a PIN diode device 3000. PIN diode device 3000 may comprise a metal layer 3010 as a top layer. Metal layer 3010 is a layer for receiving electrons incident on the electron detection device 244. Thus, metal layer 3010 is configured as a detection surface. A material of metal layer 3010 may be aluminum, for example. When aluminum is used in metal layer 3010, an oxidized layer may be formed on the exterior of the surface so as to protect electron detection device 244. PIN diode device 3000 may also comprise metal layer 3050 as a bottom layer. A material of metal layer 3050 may be copper, for example. Metal layer 3050 may comprise output lines for carrying induced current from each of the sensing elements 501, 502, 503.

PIN diode device 3000 may include a semiconductor device. For example, a semiconductor device constituting a PIN diode device may be manufactured as a substrate with a plurality of layers. Thus, sensing elements 501, 502, 503 may be contiguous in the cross sectional direction. Switching regions 3009 may be integral with the sensing elements. Additionally, sensing elements 501, 502, 503, and/or switching regions 3009 may be configured as a plurality of discrete semiconductor devices. The discrete semiconductor devices may be configured to be directly adjacent each other. Thus, even when sensing elements are configured to be discrete, an isolation area can be eliminated and dead area can be reduced.

In operation of PIN diode device 3000, a P+ region 3020 is formed adjacent to metal layer 3010. P+ region 3020 may be a p-type semiconductor layer. An intrinsic region 3030 is formed adjacent to P+ region 3020. Intrinsic region 3030 may be an intrinsic semiconductor layer. An N+ region 3040 is formed adjacent to intrinsic region 3030. N+ region 3040 may be an n-type semiconductor layer. A sensor layer of electron detection device 244 is formed as the layers of metal layer 3010, P+ region 3020, intrinsic region 3030, N+ region 3040, and metal layer 3050.

PIN diode device 3000 comprises a switching region 3009 formed between two adjacent sensing elements. As shown in FIG. 4A, a switching region 3009 is formed between sensing elements 501 and 502, and another switching region 3009 is formed between sensing elements 502 and 503. A switch may be formed in the switching region 3009. As an example, an enhancement mode MOSFET 3001 may be formed in the sensor layer of PIN diode device 3000 at switching region 3009. MOSFET 3001 may comprise a P+ region 3002, gate 3004, and gate oxide 3003. MOSFET 3001 is configured as a "normally open" type switch. In enhancement mode, voltage applied to gate 3004 increases conductivity of the device. Thus, without activating MOSFET 3001, the switch between sensing elements 502 and 503 is OFF and sensing elements 502 and 503 are thereby not connected through MOSFET 3001. By activating MOSFET 3001, the switch between sensing elements is turned ON and sensing elements 501 and 502 are connected through MOSFET 3001. For example, PIN diode device 3000 may be configured with MOSFETs operable in a turn ON state 3098 and a turn OFF state 3099. MOSFET 3001 can be controlled through gate 3004.

A process of fabricating a MOSFET, such as MOSFET 3001, may comprise etching, for example, among other techniques.

In operation, when electrons are incident on the top surface of metal layer 3010, intrinsic region 3030 is flooded with charge carriers from P+ region 3020. As can be seen in FIG. 4A, when two adjacent sensing elements, for example 501 and 502 are connected, all of the area under the metal layer 3010 in the region irradiated will be activated, including the area in switching region 3009. Thus, two adjacent sensing elements can be grouped together for collecting current in response to incident electrons, while dead area between adjacent sensing elements can be eliminated. An isolation area need not be provided to separate adjacent sensing elements, for example 501 and 502, in the cross sectional direction.

As seen in the plane view of FIG. 3E, switching region 3009A between sensing elements 501 and 502 is an activate area used for sensing. Switching region 3009B between an active sensing element 502 and an inactive sensing element 503, meanwhile, is not an active area used for sensing. Switching regions 3009 may span substantially a whole length of respective sensing elements. For example, a sensing element may have a rectangular shape extending in a first direction X and a second direction Y. The rectangular shaped sensing element may have a first side extending in the first direction and a second side extending in the second direction. A switching region 3009 may extend an entire length of the first side. Another switching region 3009 may extend an entire length of the second side. Additionally, switching regions may extend a length shorter than the first or second sides. The switching regions may be directly adjacent to the sensing element such that an active area can be made contiguous.

Figure 4B:
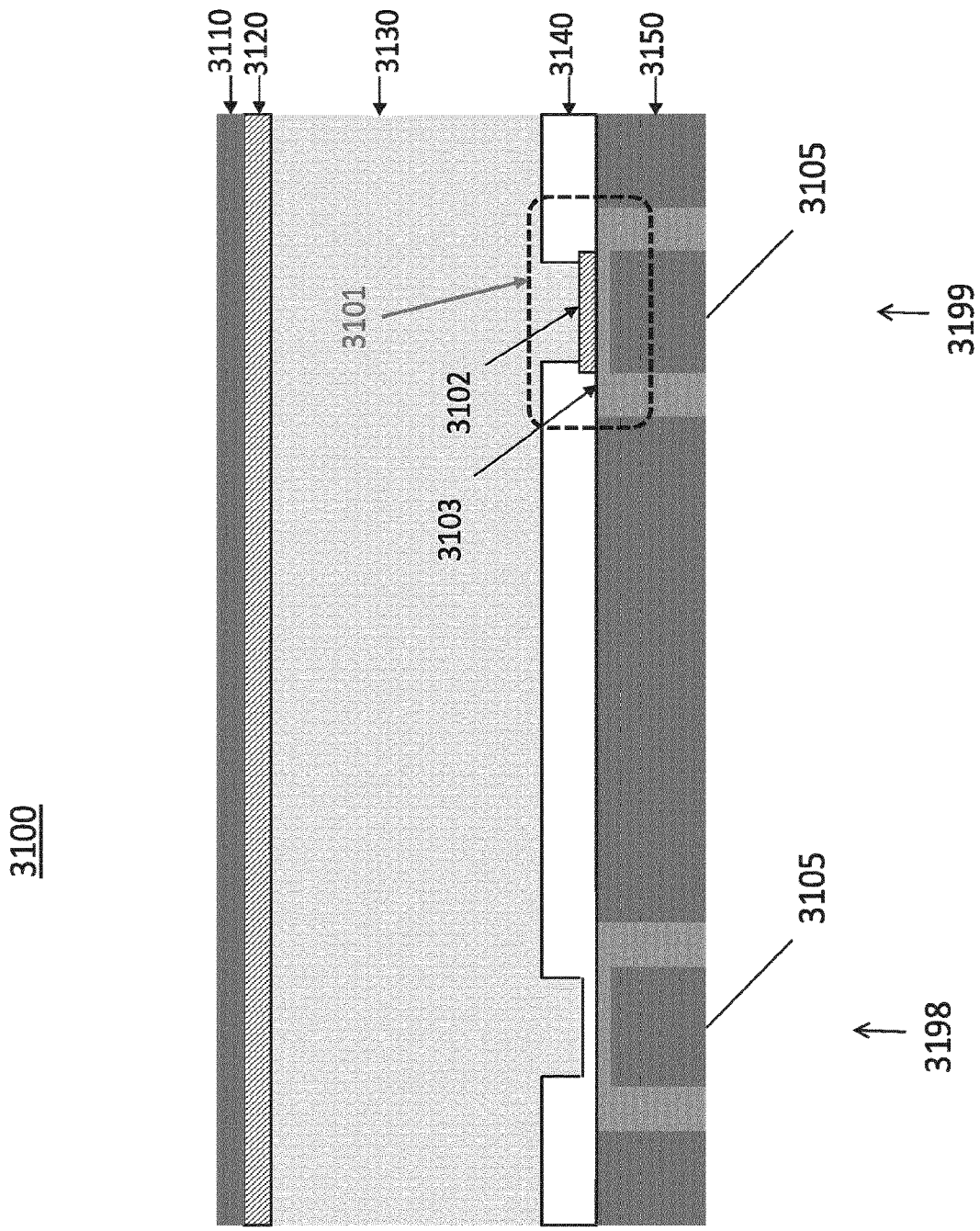
Figure 4C:
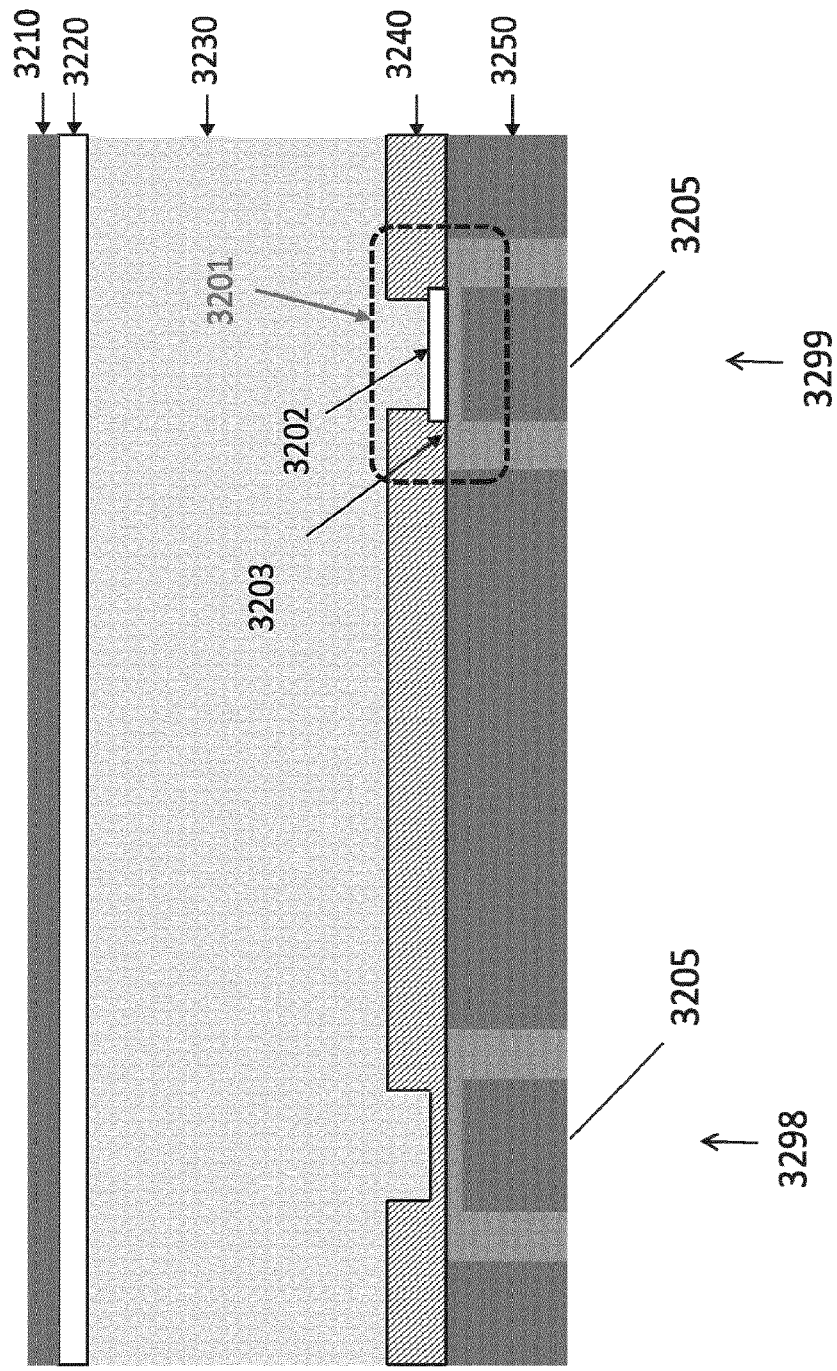
Figure 4D:
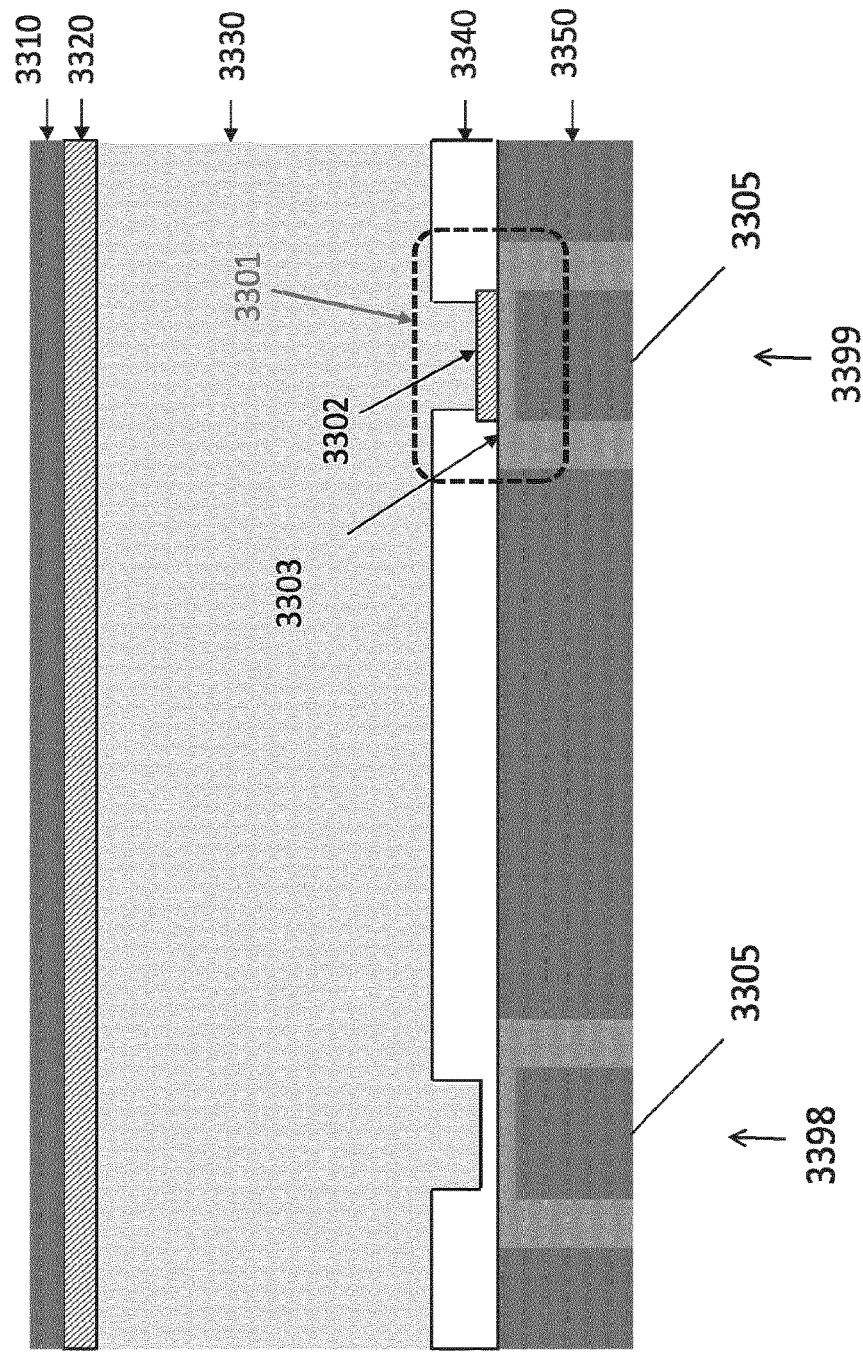
Figure 4E:
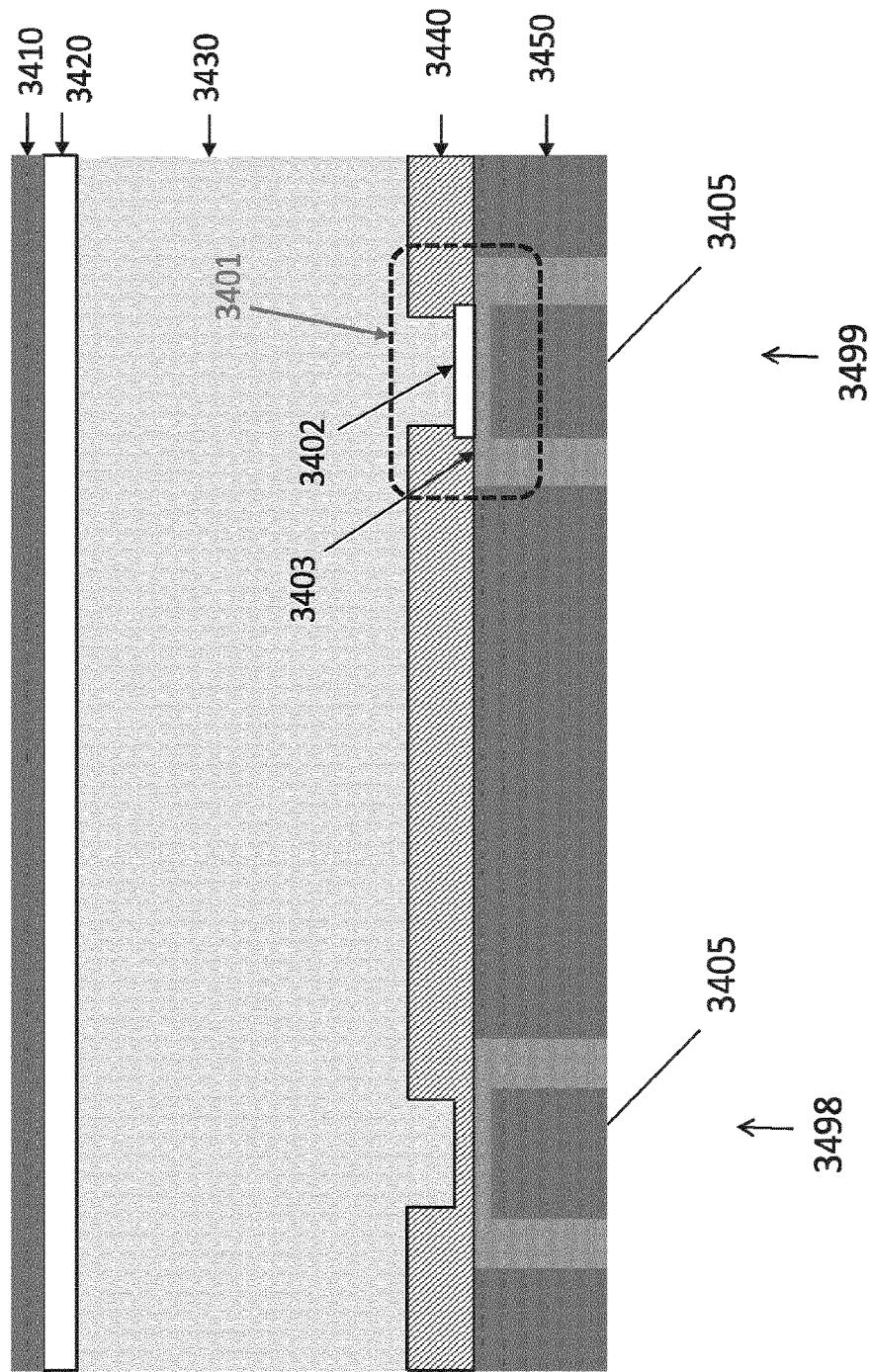

It should be appreciated that PIN diodes can be realized in various configurations employing different arrangements of p- and n-type semiconductors. For example, various forms of a diode device 3100, diode device 3200, diode device 3300, and diode device 3400 are illustrated in FIG. 4B, FIG. 4C, FIG. 4D, and FIG. 4E, respectively. Various combinations of sensor diodes and MOSFETs between the diodes are illustrated. In FIG. 4B and FIG. 4E, a MOSFET may be turned off when Vgs=0, and turned on when |Vgs|>|Vth|. In some instances, for example as shown in FIG. 4C and FIG. 4D, a depletion mode MOSFET can be used for a switch.

For example, FIG. 4B shows diode device 3100 comprising metal 3110, N+ region 3120, intrinsic 3130, P+ region 3140, metal 3150, enhancement mode MOSFET 3101, N+ region 3102, gate oxide 3103, gate 3104, and gate 3105. Diode device 3100 may be configured with MOSFETs operable in a turn ON state 3198 and a turn OFF state 3199.

For example, FIG. 4C shows diode device 3200 comprising metal 3210, P+ region 3220, intrinsic 3230, N+ region 3240, metal 3250, depletion mode MOSFET 3201, P+ region 3202, gate oxide 3203, gate 3204, and gate 3205. Diode device 3200 may be configured with MOSFETs operable in a turn ON state 3298 and a turn OFF state 3299.

For example, FIG. 4D shows diode device 3300 comprising metal 3310, N+ region 3320, intrinsic 3330, P+ region 3340, metal 3350, depletion mode MOSFET 3301, N+ region 3302, gate oxide 3303, gate 3304, and gate 3305. Diode device 3300 may be configured with MOSFETs operable in a turn ON state 3398 and a turn OFF state 3399.

For example, FIG. 4E shows diode device 3400 comprising metal 3410, P+ region 3420, intrinsic 3430, N+ region 3440, metal 3450, enhancement mode MOSFET 3401, P+ region 3402, gate oxide 3403, gate 3404, and gate 3405. Diode device 3400 may be configured with MOSFETs operable in a turn ON state 3498 and a turn OFF state 3499.

While the above descriptions discuss a metal or metal layers, it is apparent that alternatives could be used, for example, a conductive material.

When a detector having a sensor layer formed of a plurality of sensing elements includes a switching region between adjacent sensing elements, dead area can be reduced. For example, when two adjacent elements are connected, a switching region therebetween is included in an active area for sensing. As shall be discussed later, current induced by electrons incident on the surface of the detector above the switching region are included in an output signal. Thus, surface area that might otherwise be provided as isolation area separating individual pixels can be reclaimed as active sensing area. Larger sensing area can increase detection rate and provide better signal to noise ratio (SNR). Furthermore, eliminating isolation areas enables more pixels to be formed in a given area. Accordingly, a higher pixel count can be achieved.

As shown in FIG. 3E, a cross shaped area 525 may be provided. Area 525 may be an isolation area to isolate the corners of pixels from pixels which are across from each other in diagonal directions. Various shapes may be used instead of a cross. For example, area 525 may be provided as a square. Area 525 may also be provided as a diagonal line, so as to separate diagonal pixels with as small an area as possible. In some embodiments, area 525 can be eliminated to further reduce dead area.

Although sensor surface 500 is depicted as having a rectangular grid arrangement, various geometric arrangements may be used. For example, sensing elements may be arranged in a hexagonal grid. Accordingly, individual sensing elements may have correspondingly different sizes and shapes. Sensing elements may also be arranged with octagonal tiling, triangular tiling, rhombic tiling, etc. Sensing elements need not be provided as uniform shapes and with regular packing. For example, pentagonal tiling with semi-regular hexagons may be used. It is to be understood that these examples are exemplary, and various modifications may be applied.

Figure 5:
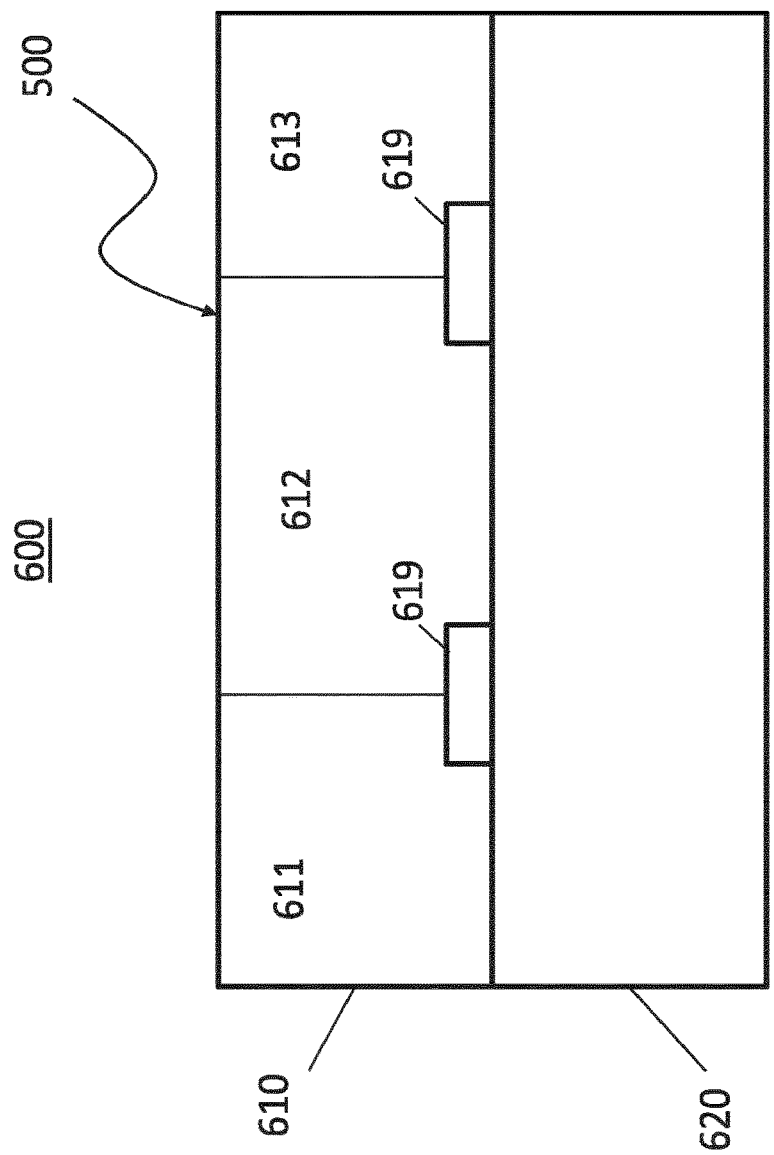
FIG. 5 is a diagram illustrating a cross sectional view of a detector, consistent with embodiments of the present disclosure.

Reference is now made to FIG. 5, which illustrates a simplified illustration of a layer structure of a detector 600. Detector 600 may be provided as detector 244 as shown in FIG. 2. Detector 600 may be configured to have a plurality of layers stacked in a thickness direction, which may be substantially parallel to an incidence direction of an electron beam. The plurality of layers may include a sensor layer 610 and a circuit layer 620. Sensor layer 610 may be provided with sensor surface 500, as described above. Sensing elements, for example sensing elements 611, 612, and 613 may be provided in sensing layer 610. Switching elements 619 may be provided between adjacent sensing elements in the cross sectional direction. Switching elements 619 may be embedded in sensing layer 610.

For example, sensor layer 610 may be configured as a diode where sensing elements 611, 612, and 613 are similar to sensing elements 501, 502, and 503, as discussed above. Furthermore, switching elements 619 may be configured as transistors, such as MOSFET 3001. Each of sensing elements 611, 612, 613 may comprise outputs for making electrical connections to circuit layer 620. Outputs may be integrated with switching elements 619, or may be provided separately. Outputs may be integrated in a bottom layer of sensor layer 610 which may be a metal layer, such as that similar to metal layer 3050.

Circuit layer 620 is provided adjacent to sensor layer 610. Circuit layer 620 comprises line wires and various electronic circuit components. Circuit layer 620 may comprise a processing system. Circuit layer 620 may be configured to receive the output current detected in sensor layer 610.

Figure 6A:
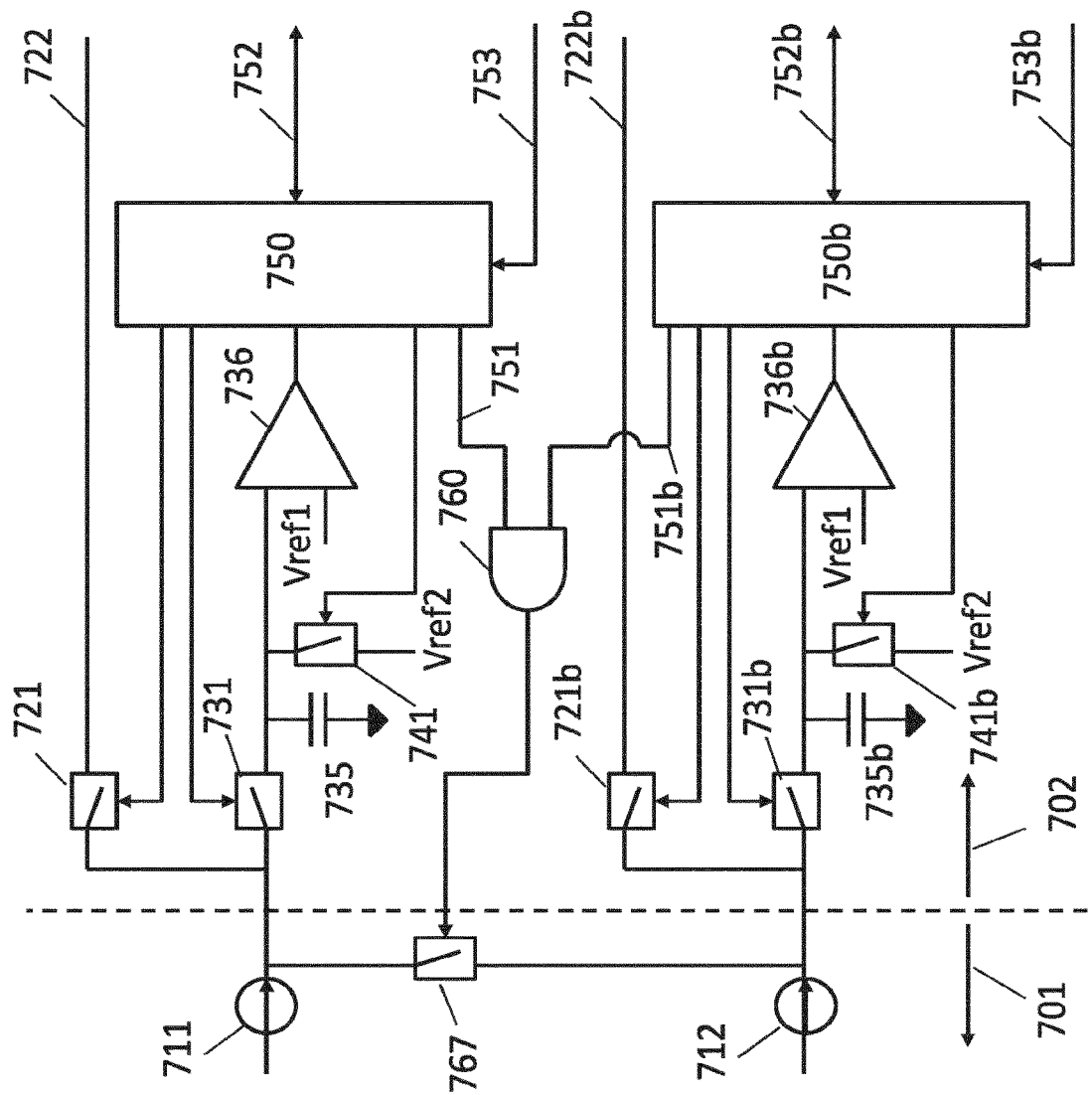
FIGS. 6A and 6B are circuit diagrams illustrating a sensor layer and circuit layer of a detector, consistent with embodiments of the present disclosure.

A circuit schematic is shown in FIG. 6A. A dashed line represents a division between a sensor die 701 and a circuit die 702. A layout such as that shown in circuit die 702, for example, may represent a circuit provided in circuit layer 620. A layout such as that shown in sensor die 701, for example, may represent a plurality of sensing elements with a switching element therebetween. For example, sensor layer 610 may be configured in a sensor die.

Figure 6B:
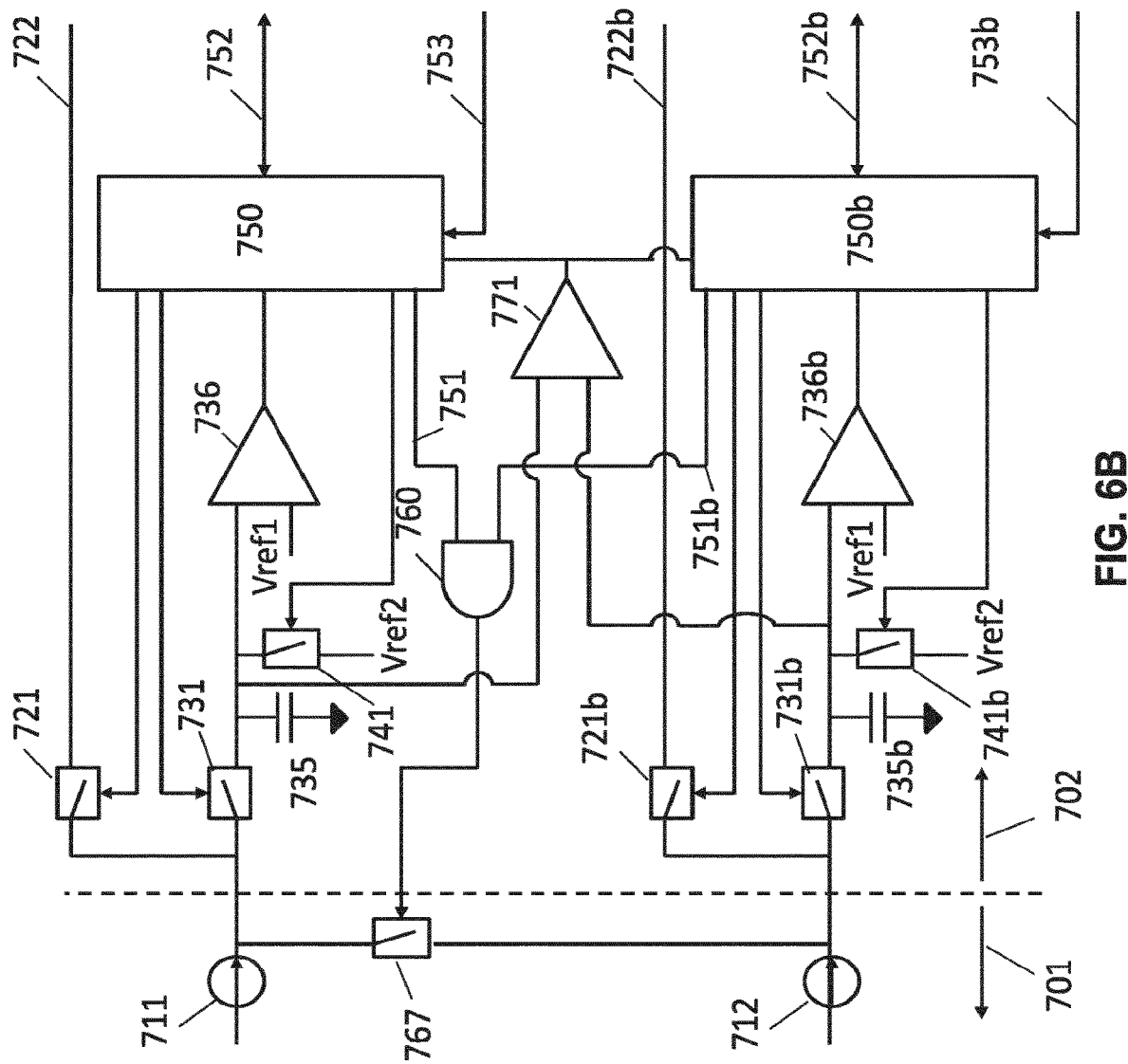

A further circuit schematic is shown in FIG. 6B. A layout shown in circuit die 702 may include an additional comparator 771, as shall be discussed later.

Figure 7:
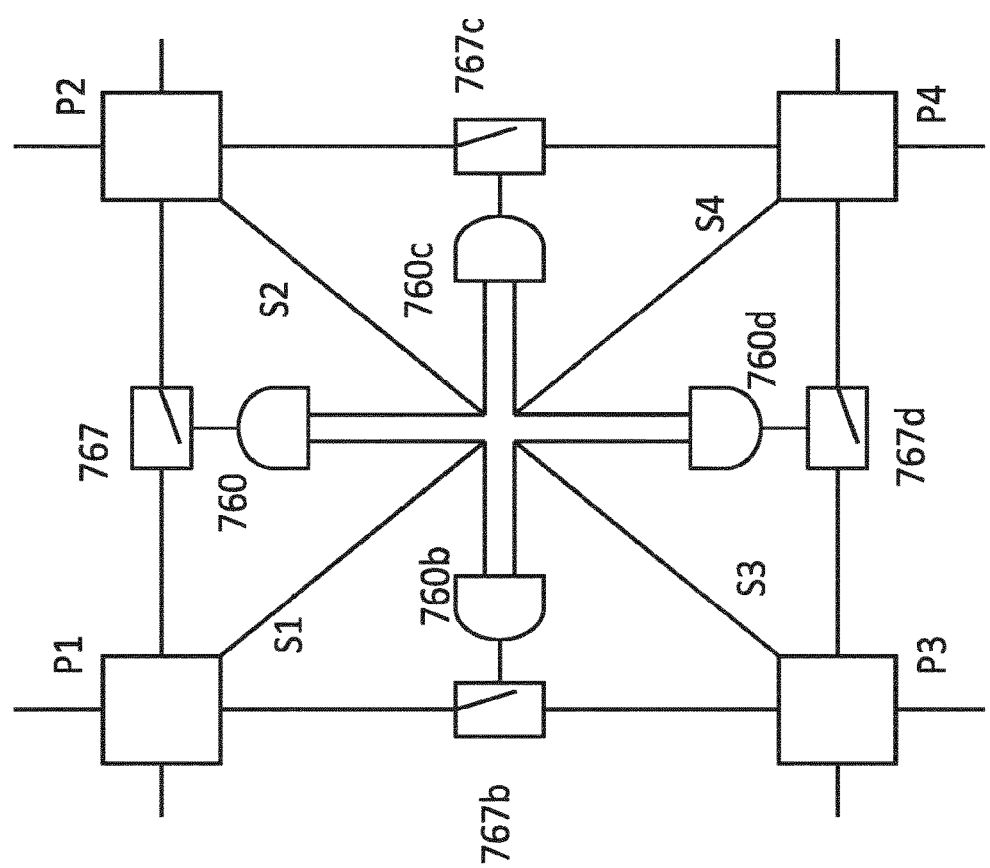
FIG. 7 is a simplified circuit schematic diagram illustrating an exemplary detector array, consistent with embodiments of the present disclosure.

A simplified circuit diagram is shown in FIG. 7. As shown in FIG. 7, a plurality of pixels P1, P2, P3, P4 may be provided. Pixels P1, P2, P3, P4 may represent pixels of a sensing array, each of which may be associated with a sensing element.

In an exemplary process of detecting signal intensity from a sensing element, a sensing element in a sensor layer is configured to gather current induced by incident charged particles. Other types of energy conversion may be used. Current is output from the sensing element to a circuit layer configured to analyze the output from the sensing element. The circuit layer may comprise a wiring layout and a plurality of electronic components to analyze the output from the sensing element.

A process of signal intensity detection will be discussed with reference to FIG. 6A. One pixel may be associated with one sensing element of a sensing array. Thus, a first pixel is configured to generate a PIN diode current 711. At the start of a process for PIN diode signal intensity detection, a switch 721 and a switch 731 are set to be open, while a switch 741 is set to be closed. Thus, voltage of a capacitor 735 can be reset to Vref2.

Next, switch 721 and switch 741 are set to be open, while switch 731 is set to be closed. In this state, capacitor 735 begins charging and generates a voltage. Capacitor 735 may be configured to charge for a predetermined period of time, for example t_charge, after which switch 731 is set to be open.

Then, comparator 736 compares the voltage at capacitor 735 to a reference value Vref1. Reference value Vref1 may be set as a predetermined signal level. Based on the reference value, a circuit may be configured to output a signal that indicates that the sensing element is gathering current from an incident electron beam. Thus, the reference value may be a suitable value that indicates that the signal level from the PIN diode is high enough to be considered to be gathering current from an incident electron beam included within a beam spot. In comparator 736, if voltage from capacitor 735 is higher than Vref1, an output signal is sent to block 750. Vref1 can be set so that each sensing element can be controlled to be included within an outer boundary of a beam spot. The value t_charge can be determined based on local logic or an external circuit, for example through a data line 752 communicating with block 750. Logic blocks and circuitry components may be set so that functions such as signal intensity detection and pixel grouping determination can occur locally. However, signal intensity of each sensing element can be collected and determinations can be made via an external path. For example, an analog signal path and ADC may communicate with an external controller via an analog signal line and a data line.

As described herein, each pixel in a sensing array may be associated with a sensing element that generates current based on incident electrons on the sensing element, and communicates with a circuit layer. Pixels may be connected to circuitry such as that discussed above with reference to the first pixel configured to generate PIN diode current 711. Thus, a second pixel may be configured to generate a PIN diode current 712, and so on. PIN diode current 712 may be connected to corresponding circuit elements, for example, switch 721b, switch 731b, switch 741b, capacitor 735b, comparator 736b, block 750b, etc.

Generation and setting of a status indicator will be discussed, again with reference to FIG. 6A. Using the output current from the sensing element, the circuit layer is configured to generate a status indicator. The status indicator may be configured to trigger a function for implementing grouping of pixels. Various methods for achieving sensing element grouping can be provided.

In a first method for grouping, sensing element grouping may be achieved according to a signal strength flag in a local logic circuit. If a first pixel and a second pixel have a strong signal strength, the two pixels may be grouped. For example, PIN diode current 711 and PIN diode current 712 may both have high current values. Namely, voltage at capacitor 735 and voltage at capacitor 735b may both be higher than Vref1. Then, a switch 767 is set to be closed so as to merge the two pixels.

If at least one of the first pixel and the second pixel has a weak signal, that is, either voltage at capacitor 735 or capacitor 735b is less than Vref1, switch 767 is set to be open so that the two pixels are not merged.

Switch 767 is configured as an element to implement a switch between two sensing elements. Switch 767 is located in sensor die 701. Switch 767 may be embedded in sensor die 701. Switch 767 may be configured as a transistor, such as MOSFET 3001.

Switch 767 may be triggered by local logic in the circuit die 702. Output from comparator 736 and output from comparator 736b may be routed to a block for activating switch 767. For example, as illustrated in FIG. 6A, an AND gate 760 is provided. AND gate 760 is arranged in circuit die 702. AND gate 760 is associated with two pixels, and is associated with one switch between the two pixels. Output from comparator 736 and 736b may be routed, directly or through other blocks, to AND gate 760. Based on signals input to AND gate 760, for example status indicator 751 and status indicator 751b, AND gate 760 is configured to toggle switch 767. When switch 767 is a transistor, such as a field effect transistor, the switch may be toggled by application of voltage to its gate. For example, in the configuration of FIG. 4A, voltage may be applied to gate 3004.

While an AND gate is illustrated, it should be appreciated that various components may be used to achieve switching of a switch arranged between sensing elements based on output signals from the sensing elements. For example, FIG. 7 is a simplified circuit diagram illustrating an arrangement of four pixels in an array. In the array, a first pixel P1 may be configured to generate a PIN diode current 711, and output a status signal S1 based thereon. Status signal S1 may correspond to status indicator 75L A second pixel P2 may be configured to generate PIN diode current 712, and output a status signal S2 based thereon. Status signal S2 may correspond to status indicator 751b. Status signal S1 from first pixel P1 and status signal S2 from second pixel P2 are input to an AND gate 760. Status signal S1 and status signal S2 can be generated based on signals generated at each of pixel P1 and pixel P2, for example, a current signal may be induced by electrons incident on the surface of the pixel. Status signal S1 may be generated based on whether current at pixel P1 reaches a predetermined threshold. Similarly, status signal S2 may be generated based on whether current at pixel P2 reaches a predetermined threshold. AND gate 760 outputs a signal based on status signal S1 and status signal S2 to switch 767. Thus, switch 767 is configured to be controlled based on input signals generated from at least two pixels. Such an input signal may be a voltage. It will be apparent that various other blocks or electrical components could be used to achieve control of switch 767.

Similar components may be provided for other pixels of the array. For example, a switch 767d is provided between pixel P3 and pixel P4. Pixel P3 and pixel P4 may be configured to output status signals S3 and S4, respectively, similar to pixels P1 and P2. Furthermore, a pixel may be in communication with multiple other pixels. For example, in addition to switch 767 configured to connect pixels P1 and P2, a switch 767b may be provided between pixels P1 and P3, and so on. Status signal S1 may be configured to be sent to multiple neighboring pixels.

In a second method for grouping, sensing element grouping may be achieved according to external logic circuits. For example, in FIGS. 6A and 6B, block 750 may be a digital logic block. Block 750 may communicate with external components via data line 752 and an address signal 753. Status indicator 751 can be overwritten by external logic circuitry via data line 752 to control the status of switch 767. Such external logic circuitry may also be provided in circuit die 702, or may be provided as a separate system attached to block 750 by an input/output device.

In some embodiments, local control logic associated with each pixel generates an indication of signal level of its corresponding sensing element. This indication can be used to determine whether two adjacent sensing elements should be connected by the MOSFET formed between them. In this way, groups of sensing elements can be formed. Based on the formed groups, a primary boundary can be formed.

To generate gradient information on signal intensity, additional comparator 771 may be provided, as shown in FIG. 6B. A result from comparator 771 can be fed to logic blocks 750 and 750b. With an arrangement including comparator 771, processing may be carried out to generate a value representing the intensity of a beam spot based on the determined primary boundary. Grouping can be carried out based on which electron sensing elements are determined to lie outside the primary boundary of the beam spot.

In electron beam imaging, beamlet image acquisition may be carried out. A process of image acquisition will be discussed with reference to FIG. 6A. Initially, switch 721 and switch 731 are set to be open, while switch 741 is set to be closed. For each row of a detector array, switch 721 (or a corresponding switch) is set to be closed, one-by-one. By sequentially closing switch 721 and corresponding switches, electronic scanning of a detector surface can be carried out. Scanning may be implemented to read the analog signal of each pixel. For example, analog output line 722 may be configured to be read by an analog path, output to external devices, or sent to an analog-to-digital converter (ADC).

Based on signals output from analog output line 722, image reconstruction of beams or beamlets can be achieved. A controller may be used to conduct image acquisition based on the reconstructed image. The reconstructed image can be used to determine the boundary of a group of sensing elements. For example, one group can be defined to correspond to one beamlet. Summed signal intensity of the sensing elements in the group is thus representative of the current of the one beamlet. The reconstructed image can also be used to evaluate the performance of the electron optical system. For example, primary projection optical system 220 and/or secondary optical system 242 may be adjusted based on the reconstructed image. The reconstructed image may be used to compensate for imperfections or drift in electron optical sub-systems.

Moreover, a low impedance output path of current signal from groups of pixels can be achieved. For example, a plurality of switches, such as switch 721, may be provided for a plurality of pixels in the same group. Pixels of the same group may be in close proximity. A plurality of analog signal lines, such as analog output line 722, may be routed to a grouped output Additionally, the plurality of analog signal lines may be connected when they are grouped to the same group of the plurality of pixels.

While an example has been discussed with reference to electron beam inspection systems, it should be noted that for photo image sensor applications, a buffer can be added after switch 721 to improve performance.

In an exemplary embodiment of a detector array, individual sensing elements in the detector array can be enabled or disabled. In normal operation for electron beam imaging, certain sensing elements may be enabled to detect incident beam current.

For example, with reference to FIG. 6A, a pixel may be enabled when voltage at capacitor 735 is greater than or equal to Vref1. A pixel may also be enabled by external logic circuits, for example in an override mode. In override mode, switch 721 may be open or closed depending on a control signal from external logic to decide the signal output routing. In override mode, switch 731 may be set to be open and switch 741 may be set to be closed.

A pixel may be disabled when voltage at capacitor 735 is lower than Vref1. A pixel may also be disabled by external logic circuits, for example in an override mode. In an override mode for disabling, switch 721 may be set to be open. Switch 731 and switch 741 may be set to be closed.

Operation in override modes may be conducted when, for example, it is determined that crosstalk is present in the sensing elements. Crosstalk can occur when a beam partially overlaps with an adjacent beam due to aberration, dispersion, and the like. In some embodiments, a processing system can detect the occurrence of partial overlapping based on primary or secondary beam spot boundaries. The processing system can exclude outputs from some sensing elements that are located in the area where beam spots overlap when determining intensity values of beam spots.

Figure 8:
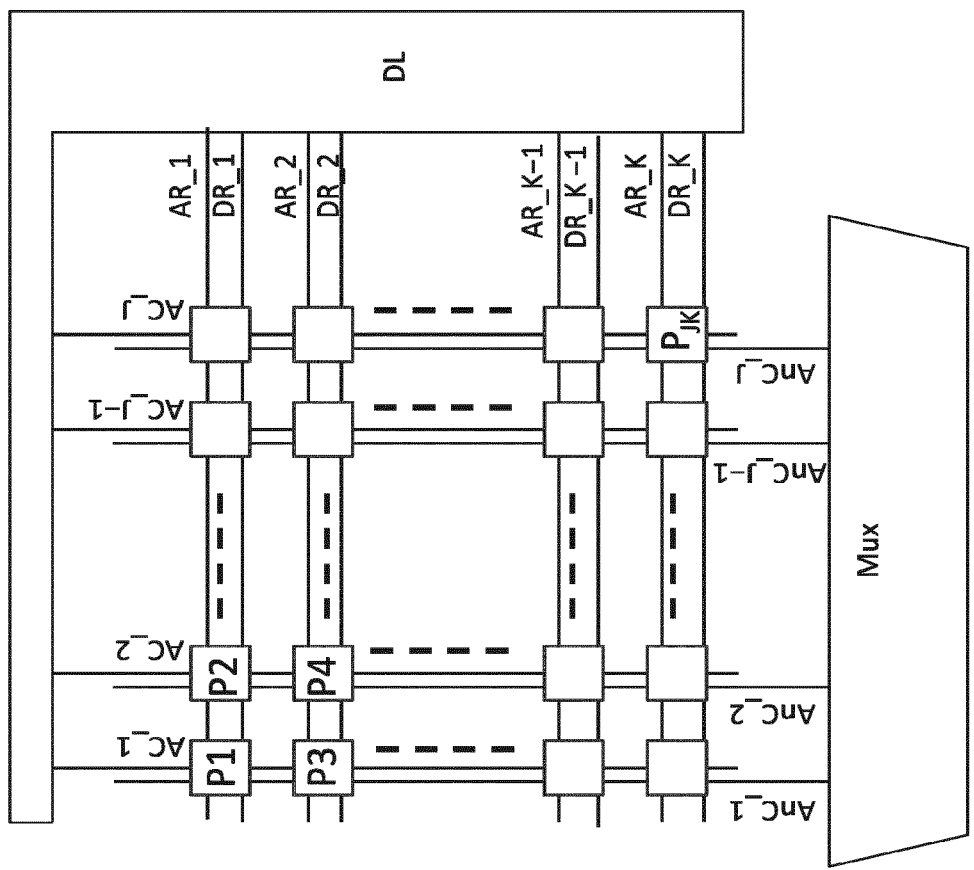
FIG. 8 is a diagram illustrating one or more circuits relating location data of sensing elements, consistent with embodiments of the present disclosure.

Reference is now made to FIG. 8, which illustrates a diagram relating location data of sensing elements. A detector array may comprise a plurality of sensing elements arranged to form J×K pixels having M×N channels. A single sensing element may be represented by pixel P1. Pixel P1 has an address column AC_1. Pixel P2 has an address column AC_2, and so on. For example, in the exemplary array having J×K pixels, pixel $P_{JK}$ has an address column AC_J and an address row AR_K. Each column may have an analog column. For example, pixel P1 has analog column AnC_1, which carries output current from the sensing element of pixel P1.

Each sensing element can be selected by address column and address row signals. For example, pixel P1 may be addressed by AC_1 and AR_1.

Data can be read and written by data row signals to each local logic circuit associated with each sensing element. For example, data can be sent to and received from pixel P1 via data row DR_1. Digital logic DL may control data read/write, etc.

Analog signal from each sensing element may travel through corresponding analog column lines to reach a multiplexer Mux. Multiplexer Mux may be located in the detector array. Multiplexer Mux may also be external to the detector array. Multiplexer Mux may have J inputs and M×N outputs.

Pixels can be identified and grouped by their respective address line information. Any two pixels in a detector array can be in communication. Thus, grouping between any arbitrary number of pixels, in any arbitrary locations, can be achieved.

Location information of the plurality of sensing elements may be used in various ways. For example, location information may be correlated with beam intensity to determine boundaries of beam spots. Additionally, based on the locations of the electron sensing elements that give rise to signal intensity comparator decisions, the processing system can identify a location on the sensor surface where a transition between the intensity gradients occurs. Intensity gradient information can be used for determinations involving primary and secondary boundaries. In some embodiments, location data may also be used to operate in override modes to control switching elements between two pixels independently of local logic.

A processing system, for example, a processor embedded in circuit die 702 or externally connected may perform processing to determine identified locations as part of a beam boundary. The processing system may comprise an arrangement of comparators configured to perform processing based on voltage comparisons for each row and column of electron sensing elements to determine a set of locations on the detector array surface that may make up a beam boundary.

In some embodiments, the processing system can also improve the fidelity of image reconstruction by compensating for the effect of noise signals using boundary information. The processing system can exclude signals received from outputs of electron sensing elements that are determined to be located outside a beam primary boundary. This can improve fidelity of image reconstruction by eliminating the random noise signals from electron sensing elements outside the primary boundary.

In FIG. 8, lines interconnecting a plurality of sensing elements, for example lines illustrated as AC_1, AR_1, DR_1, AnC_1, etc. may be wire lines patterned by printing a conductive material on a substrate. Wire lines can be manufactured in various manners, such as by normal processes used in fabricating a MOSFET. The wire lines may be part of a circuit layer of a detector array.

Figure 9:
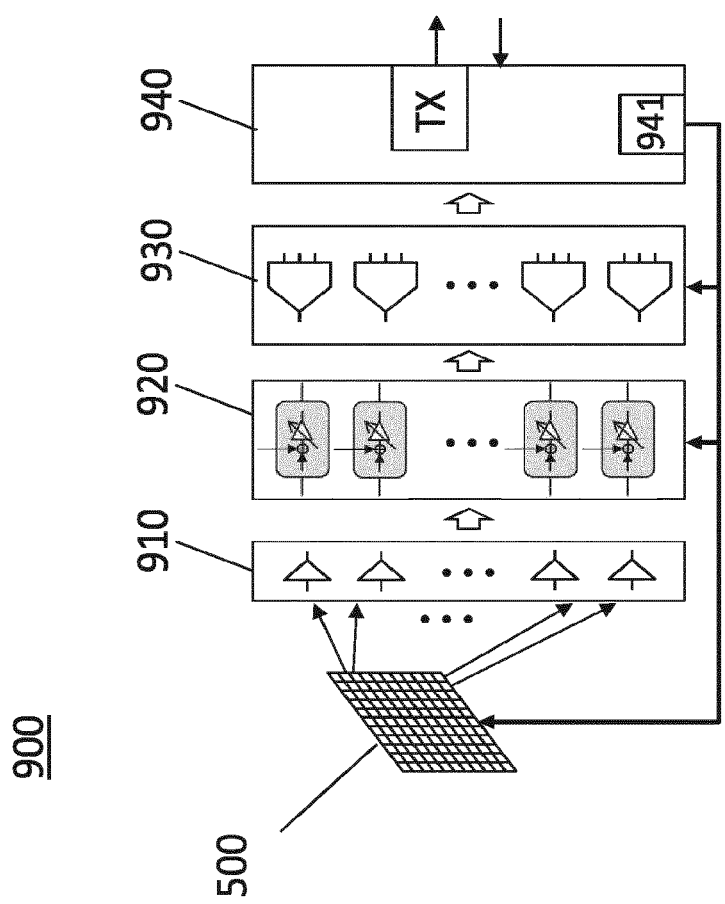
FIG. 9 is a diagram illustrating a detection system using a detector array comprising a plurality of sensing elements, consistent with embodiments of the present disclosure.

Reference is now made to FIG. 9, which illustrates a detection system 900 using a detector array comprising a plurality of sensing elements. A detector array may be provided having a detector sensor surface 500 that can be used on electron detection device 244. The detector array may comprise J×K pixels, and have M×N outputs to be connected with a multiplexer, for example multiplexer Mux. The detector array may be constructed as a substrate including a sensor layer and a circuit layer, as discussed herein.

The detector array may be connected to a signal conditioning circuit array 910. Signal conditioning circuit array 910 may have M×N inputs and outputs so as to match the detector array.

Signal conditioning circuit array 910 may be connected to a parallel analog signal processing path 920 for providing gain and offset control. Parallel analog signal processing path 920 may have M×N inputs and outputs so as to match the detector array.

Parallel analog signal processing path 920 may be connected to a parallel ADC 930, which may have M×N inputs and outputs so as to match the detector array.

Parallel ADC 930 may be connected to digital control unit 940. Digital control unit 940 may comprise a controller 941 which can communicate with parallel analog signal processing path 920, parallel analog signal processing path 920, and with the detector array. Digital control unit 940 may send and receive communications from a deflection and image control (DIC) unit via a control signal and a transmitter TX.

An external controller, such as controller 941, may be configured to execute imaging control. For example, controller 941 may be configured to generate an image of detected beamlets. Furthermore, grouping can be determined on the basis of primary and secondary beam spot boundaries.

In some embodiments, a switching matrix need not be provided in detection system 900. Since switches are integrated in the detector array, for example in a sensor layer of the detector array, a construction which is more apt for being scaled up can be achieved.

Furthermore, since J×K pixels are initially grouped in M×N groups in the detector, the number of output may be reduced. Output from a plurality of pixels that are grouped may have a common output. For example, an arrangement having M×N outputs can be achieved. The total number of outputs may be largely reduced compared to conventional detector arrays.

The detector array may comprise its own memory so that the detector array can store an arrangement of the plurality of sensing elements and their associated circuitry. For example, the status of local indication 751, and the grouping of sensing elements can be stored in the memory. A state of switches can be stored in the memory.

The embodiments may further be described using the following clauses:

1. A detector comprising:
   a substrate comprising a plurality of sensing elements including a first element, a second element, and a switching region configured to connect the first element and the second element,
   wherein the first element is configured to generate a first signal in response to the first element detecting first charges particles that indicate a beam, and the second element is configured to generate a second signal in response to the second element detecting second charged particles that indicate the beam, and
   wherein the switching region is configured to be controlled based on the first signal and the second signal.
2. The detector of clause 1, further comprising:
   a sensor die that includes the substrate; and
   a circuit die that includes one or more circuits configured to control the switching region.
3. The detector of any one of clauses 1 and 2, wherein the switching region comprises a switch configured to connect the first element and the second element.
4. The detector of any one of clauses 1-3, wherein the substrate comprises a diode configured to transport charge carriers in the switching region.
5. The detector of any one of clauses 1-4, wherein
   the first element is configured to generate the first signal in response to the first element receiving charged particles with a first predetermined amount of energy, and the second element is configured to generate the second signal in response to receiving charged particles with a second predetermined amount of energy.
6. The detector of any one of clauses 1-4, wherein
   the first element is configured to generate the first signal in response to the first element receiving electrons with a first predetermined amount of energy, and the second element is configured to generate the second signal in response to receiving electrons with a second predetermined amount of energy.
7. The detector of any one of clauses 1-6,
   wherein, in a thickness direction, the substrate comprises:
   a top metal layer configured as a detection surface, and
   a bottom metal layer, and wherein, in a cross section, an entire area between the top metal layer and the bottom metal layer is a charge carrier region.
8. The detector of clause 7, wherein the switching region comprises a field effect transistor, the field effect transistor comprises a gate fabricated in the bottom metal layer or a contact of the gate fabricated in the bottom metal layer.
9. A detector comprising:
a sensor layer comprising:
  an array of sensing elements including a first element and a second element wherein the first element and the second element are adjacent; and
  a switching region between the first element and the second element; and
a circuit layer comprising one or more circuits electrically connected to the first element and the second element, the one or more circuits configured to:
  generate a first status indicator when the first element receives charged particles with a predetermined amount of energy,
  generate a second status indicator when the second element receives charged particles with a predetermined amount of energy; and
  control the switching region based on the first status indicator and the second status indicator.
10. The detector of clause 9, wherein
the circuit is configured to control the switching region between a first state and a second state,
wherein in the first state the switching region is part of an active group,
wherein in the second state the switching region is part of an inactive group.
11. The detector of any one of clauses 9 and 10, wherein the switching region comprises a transistor.
12. The detector of any one of clauses 9-11, wherein in a plane view of the substrate, the first element, the second element, and the switching region are contiguous along a first direction in which the first element and the second element are arranged.
13. A detector system, comprising
a detector array comprising a plurality of sensing elements including a first element and a second element; and a switching region configured to connect the first element and the second element;
one or more circuits configured to generate a first signal in response to the first element detecting first charged particles that indicate a beam, and generate a second signal in response to the second element detecting second charged particles that indicate the beam; and
a controller connected to any of the one or more circuits.
14. The system of clause 13, wherein
the controller is configured to control the switching region based on an address of at least one of the first element and the second element.
15. The system of any one of clauses 13 and 14, wherein the controller is configured to acquire an image of the beam, and generate a command signal based on the image; and
the one or more circuits are configured to control the switching region based on the command signal.
16. The system of any one of clauses 13-15, wherein the detector array comprises a first number of pixels configured to be grouped in a second number of groups, the second number being less than the first number.
17. The system of clause 16, further comprising:
a signal conditioning circuit array;
a parallel analog signal processing path array;
a parallel analog-to-digital converter array; and
a digital control unit,
wherein the signal conditioning circuit array, the parallel analog signal processing path array, the parallel analog-to-digital converter array, and the digital control unit are connected to the detector array via a plurality of channels, a number of the plurality of channels being greater than or equal to the second number.
18. The system of any one of clauses 13-17, wherein the controller is configured to override a local logic of the one or more circuits.
19. The system of any one of clauses 13-18, wherein the one or more circuits comprise the controller.
20. The system of any one of clauses 13-18, wherein the controller is external to the detector array.
21. The system of any one of clauses 13-20, wherein the first element and the second element have a common output.
22. The system of clause 17, wherein the number of the plurality of channels is equal to the second number.
23. The detector of any one of clauses 5 or 6, wherein the first predetermined energy and the second predetermined energy are a same predetermined energy.
24. The detector of any one of clauses 5 or 6, wherein the first predetermined energy and the second predetermined energy are different predetermined energies.
25. The detector of clause 5, wherein the charged particles are electrons.

The block diagrams in the Figures illustrate the architecture, functionality, and operation of possible implementations of systems, methods, and computer hardware/software products according to various exemplary embodiments of the present disclosure. In this regard, each block in a flowchart or block diagram may represent a module, segment, or portion of code which comprises one or more executable instructions for implementing the specified logical functions. It should be understood that in some alternative implementations, functions indicated in the block may occur out of the order noted in the Figures. For example, two blocks shown in succession may be executed or implemented substantially concurrently, or two blocks may sometimes be executed in reverse order, depending upon the functionality involved. It should also be understood that each block of the block diagrams, and combination of the blocks, can be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof. For example, while an exemplary detector has been set forth and described with respect to an electron beam system, a detector consistent with aspects of the present disclosure may be applied in a photo detector system, x-ray detector system, and other detection systems for high energy ionizing particles, etc. Detectors according to aspects of the present disclosure may be applied in a scanning electron microscope (SEM), a CMOS image sensor, a consumer camera, a specialized camera, or industry-use camera, etc.

It is intended that the scope of the invention should only be limited by the appended claims.

The invention claimed is:

1. A detector comprising:
a substrate comprising a plurality of sensing elements including a first element, a second element, and a switching region configured to connect the first element and the second element, the switching region being configured to form an active sensing area between the first element and the second element,
wherein the first element is configured to generate a first signal in response to the first element detecting first charged particles that indicate a beam, and the second element is configured to generate a second signal in response to the second element detecting second charged particles that indicate the beam, and
wherein the switching region is configured to group together the first element and the second element.

2. The detector of claim 1, further comprising:
a sensor die that includes the substrate; and
a circuit die that includes a circuit configured to control the switching region.

3. The detector of claim 2, wherein the circuit configured to control the switching region comprises a plurality of circuits.

4. The detector of claim 2, wherein the switching region comprises a switch configured to connect the first element and the second element.

5. The detector of claim 1, wherein the substrate comprises a diode configured to transport charge carriers in the switching region.

6. The detector of claim 5, wherein
the first element is configured to generate the first signal in response to the first element receiving charged particles with a first predetermined amount of energy, and the second element is configured to generate the second signal in response to receiving charged particles with second a predetermined amount of energy.

7. The detector of claim 6, wherein the charged particles are electrons, and wherein the first predetermined amount of energy and the second predetermined amount of energy are both a same predetermined about of energy.

8. The detector of claim 1, further comprising:
a first output signal path connected to the first element; and
a second output signal path connected to the second element,
wherein the switching region is configured to connect the first output signal path and the second output signal path.

9. The detector of claim 1, wherein the first element, the second element, and the switching region are contiguous along a first direction in which the first element and the second element are arranged.

10. A detector system, comprising:
a detector array comprising a plurality of sensing elements including a first element and a second element, and a switching region configured to connect the first element and the second element, the switching region including a charge carrier region between the first element and the second element;
a circuit configured to generate a first signal in response to the first element detecting first charges particles that indicate a beam, and generate a second signal in response to the second element detecting second charges particles that indicate the beam;
a controller connected to the circuit;
a signal conditioning circuit array;
a parallel analog signal processing path array;
a parallel analog-to-digital converter array; and
a digital control unit,
wherein the detector array comprises a first number of pixels configured to be grouped in a second number of groups, the second number being less than the first number,
wherein the signal conditioning circuit array, the parallel analog signal processing path array, the parallel analog-to-digital converter array, and the digital control unit are connected to the detector array via a plurality of channels, a number of the plurality of channels being greater than or equal to the second number.

11. The system of claim 10, wherein
the controller is configured to control the switching region based on an address of any of the first element and the second element.

12. The system of claim 10, wherein
the controller is configured to acquire an image based on the beam, and generate a command signal based on the image; and
the circuit is configured to control the switching region based on the command signal.

13. The system of claim 10, wherein the circuit configured to generate the first signal comprises a plurality of circuits, and wherein the controller being connected to the circuit includes the controller being connected to any of the plurality of circuits.

14. A detector comprising:
a sensor layer comprising:
an array of sensing elements including a first element and a second element wherein the first element and the second element are adjacent; and
a switching region between the first element and the second element; and
a circuit layer comprising one or more circuits electrically connected to the first element and the second element, the one or more circuits configured to:
generate a first status indicator when the first element receives charged particles with a first predetermined amount of energy,
generate a second status indicator when the second element receives charged particles with a second predetermined amount of energy; and
control the switching region based on the first status indicator and the second status indicator.

15. The detector of claim 14, wherein
the one or more circuits is configured to control the switching region between a first state and a second state,
wherein in the first state the switching region is part of an active group,
wherein in the second state the switching region is part of an inactive group.

16. The detector of claim 14, wherein the switching region comprises a switching element.

17. The detector of claim 16, wherein the switching element is a transistor.

18. The detector of claim 16, wherein the switching element is embedded in the sensor layer.

19. The detector of claim 16, wherein each of the first element and the second element comprises outputs for making electrical connections to the circuit layer.

20. The detector of claim 19, wherein the outputs are integrated with the switching element or provided separately.

* * * * *